United States Patent [19]
Krafcik et al.

[11] Patent Number: 5,811,930
[45] Date of Patent: Sep. 22, 1998

[54] ELECTROLUMINESCENT LAMP DEVICES AND THEIR MANUFACTURE

[75] Inventors: Robert J. Krafcik, Phoenix; Douglas T. Wheeler, Tempe; Walter J. Paciorek; Ralph McGuigan, both of Phoenix; Rodney T. Eckersley, Tempe, all of Ariz.; Dee Lynn Johnson; Harold T. Munson, both of Woodbury, Minn.

[73] Assignee: Durel Corporation, Chandler, Ariz.

[21] Appl. No.: 731,519

[22] Filed: Oct. 15, 1996

Related U.S. Application Data

[63] Continuation of Ser. No. 407,269, Mar. 20, 1995, Pat. No. 5,565,733, which is a continuation of Ser. No. 991,295, Dec. 16, 1992, abandoned.

[51] Int. Cl.⁶ ............................. H01J 1/62; H01J 63/04; G09F 13/22; G09G 3/12
[52] U.S. Cl. .................. 313/510; 313/511; 313/512; 313/506; 40/544
[58] Field of Search ...................... 313/510, 511, 313/512, 513, 515, 506; 40/541, 542, 544, 611, 618, 624

[56] References Cited

U.S. PATENT DOCUMENTS

| | | |
|---|---|---|
| 2,644,113 | 6/1953 | Etzkorn . |
| 2,791,050 | 5/1957 | Neugass . |
| 2,872,567 | 2/1959 | Strange . |
| 3,015,718 | 1/1962 | Petri . |
| 3,037,137 | 5/1962 | Motson . |
| 3,161,797 | 12/1964 | Butler et al. . |
| 3,161,974 | 12/1964 | Blockson . |
| 3,286,115 | 11/1966 | Ranby et al. . |
| 3,670,067 | 6/1972 | Coolbaugh et al. . |
| 3,894,225 | 7/1975 | Chao . |
| 4,471,350 | 9/1984 | Chow . |
| 4,687,968 | 8/1987 | Frayer . |
| 4,774,434 | 9/1988 | Bennion . |
| 4,816,717 | 3/1989 | Harper et al. . |
| 4,839,558 | 6/1989 | Mierzwinski . |
| 4,853,594 | 8/1989 | Thomas . |
| 4,904,901 | 2/1990 | Simopoulos et al. . |
| 4,936,511 | 6/1990 | Johnson et al. . |
| 5,264,061 | 11/1993 | Juskey et al. . |

FOREIGN PATENT DOCUMENTS

| | | |
|---|---|---|
| 2320142 | 4/1973 | Germany . |
| 2275492 | 11/1990 | Japan . |

*Primary Examiner*—Nimeshkumar Patel
*Attorney, Agent, or Firm*—Fish & Richardson P.C.

[57] ABSTRACT

An electroluminescent lamp unit includes a flat deformable substrate of preselected size having smaller sheet-form flexible electroluminescent lamps secured face-to-face at preselected positions on a surface of the substrate, the lamps connected with conductive traces on the substrate. The flat substrate with secured lamps can be deformed into a desired shape to provide a relatively inexpensive and reliable electroluminescent lamp unit applicable for a wide variety of applications. The flexible electroluminescent lamps of the unit can be individually addressable and may have different colors or intensities. A method of manufacture of such units employs surface mount technology in an automated version, pick and place robots select and place the lamps as instructed, followed by ultrasonic welding or mechanical or adhesive fastening.

18 Claims, 22 Drawing Sheets

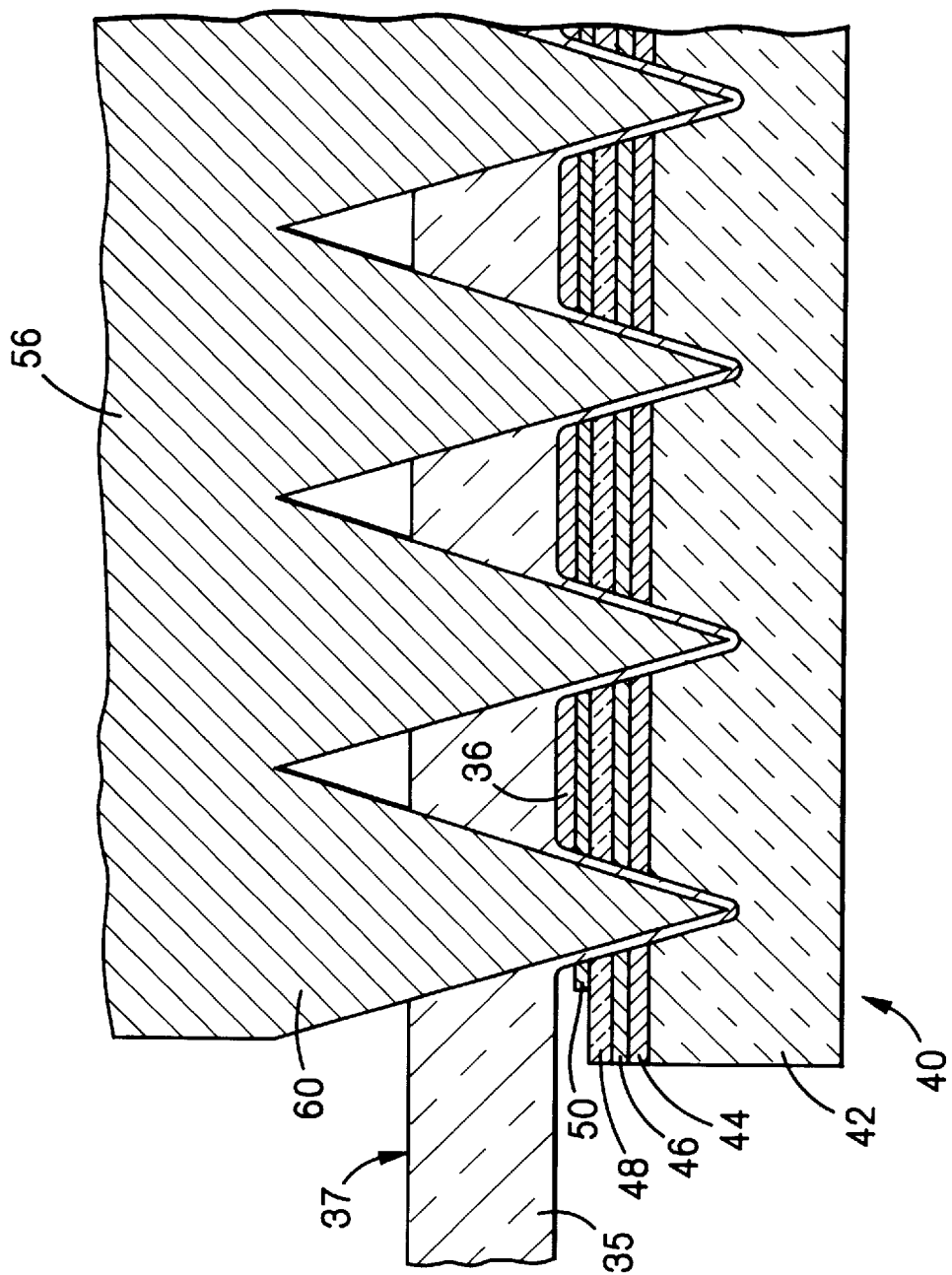

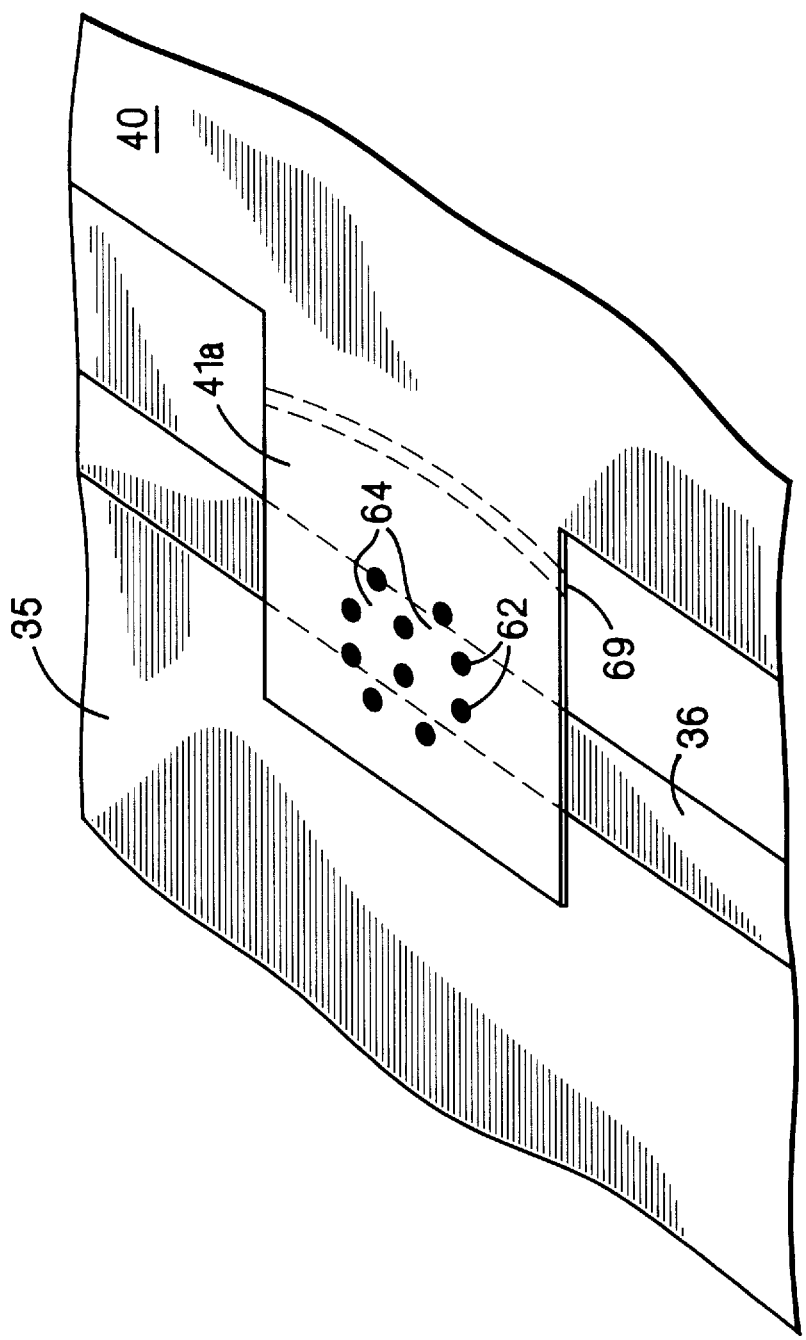

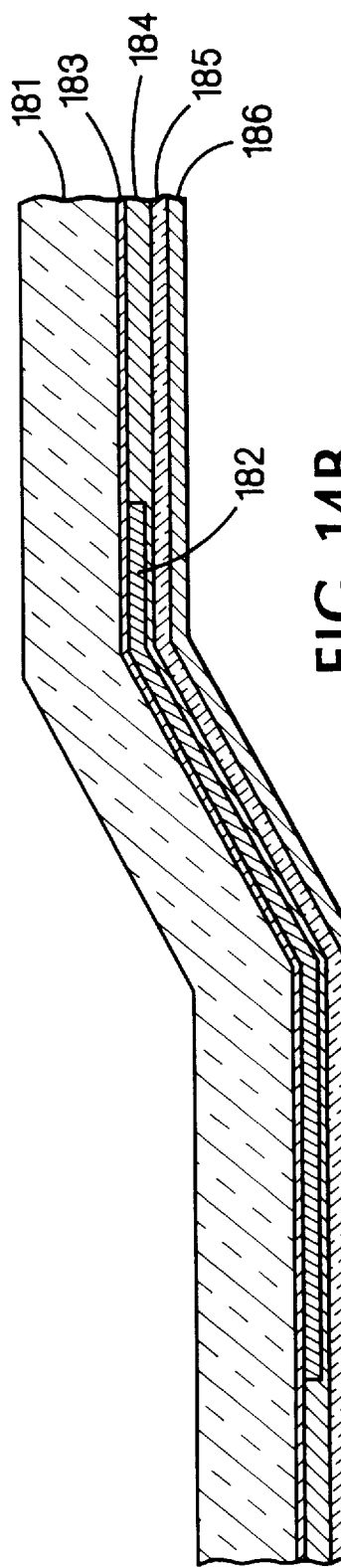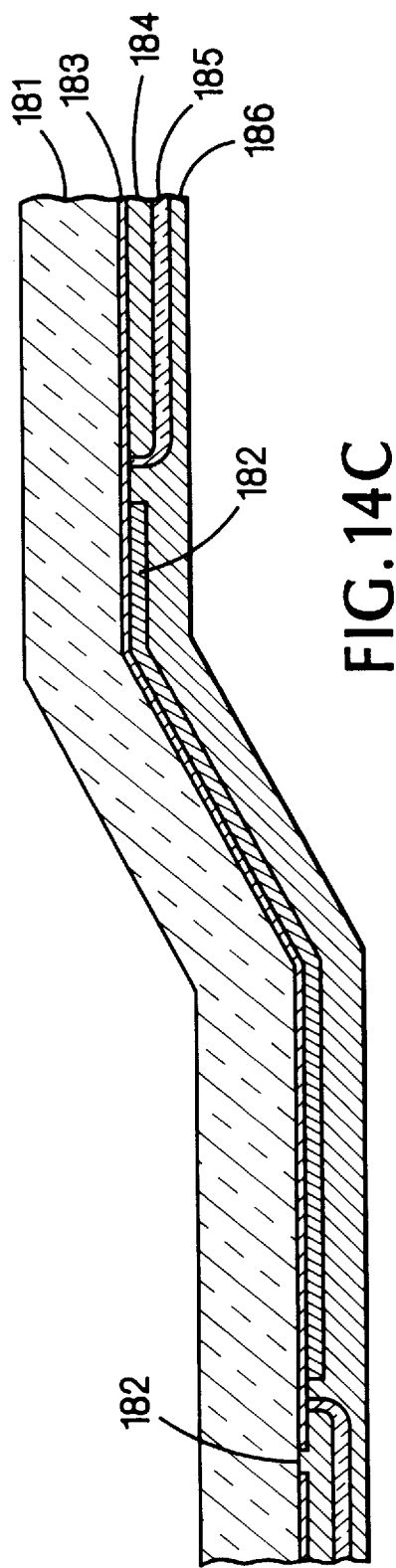

ELECTROLUMINESCENT LAMP DEVICES AND THEIR MANUFACTURE

This is a continuation of application Ser. No. 08/407,269, filed Mar. 20, 1995, now U.S. Pat. No. 5,565,733; which is a continuation of application Ser. No. 07/991,295, filed Dec. 16, 1992, which is abandoned.

BACKGROUND OF THE INVENTION

This invention relates to the achievement of low cost and versatile electroluminescent lamp products.

As is known by those in the art, an electroluminescent lamp is a surface-area light source consisting of a suitable phosphor placed between electrodes, one of which is essentially transparent. When an alternating current is applied between the electrodes the phosphor emits light, the color of the light dependent on the choice of phosphor.

Such lamps are suitable for a wide variety of applications, including illuminated instrument panels, dial indicators, signs and the like. Such electroluminescent lamp panels can be fabricated by applying a general coating of conductive material, such as indium tin oxide, over the entire substrate panel, the coating providing the material for one of the electrodes, upon which the phosphor and rear electrode layers are applied. In many applications, the full surface of the panel is not required to be light emitting and the unlit portion is masked by printing an opaque ink on the front surface of the lamp. Alternatively, as described in U.S. Pat. No. 4,904,901, material (indium tin oxide) corresponding to the transparent layer is deposited over an entire surface of the panel and is thereafter removed from most of the surface with an acid etch leaving behind areas corresponding to discrete areas of illumination. The phosphor and rear electrode layers are then deposited over the discrete areas. Likewise, either the phosphor or the rear electrode can be applied over desired areas using techniques well-known in the art.

SUMMARY OF THE INVENTION

According to the invention, for forming a modular lamp unit, flat-form flexible electroluminescent lamps of selected limited size are placed and secured upon a larger printed circuit substrate employing surface mount techniques. The substrate and secured lamps can be subsequently deformed into a desired shape or incorporated as is into a product. Alternatively, the lamp and the substrate may be subject to separate preforming operations and can then be joined together. In all these cases, the area occupied by the lamp is restricted solely to the area desired to be illuminated. Thus, the invention reduces production cost by significantly reducing the area covered by the lamp. As is known in the art, conductive materials (e.g. indium tin oxide) used to provide an electrode of the lamp can be relatively expensive. Further, smaller segmented and individually addressable lamps consume less electrical power, generate less heat and are more reliable than large full area lamps having opaque patterns over unlit portions of the lamp. Opaque patterns for covering lit line traces between desired areas of illumination are also eliminated. Automation of the process for placing and securing individual lamps is preferably achieved by programmed pick and place robots for selecting and placing the lamp on the surface of a receiving printed circuit substrate according to pre-specified instructions, followed by automated steps to connect and secure the lamps to the substrate.

Shaping the lamps and substrate permits their use in a wide variety of applications, e.g., to accommodate special aesthetic designs or where space is limited. In addition, the flexible nature of the lamps and use of a flexible substrate permit their use in applications where the flexible substrate is actuated, such as in the opening and closing of a cassette player door. Novel thermalforming techniques enable molding of a preformed lamp member into a stable desired three-dimension shape without impairing the function of the lamp.

The invention also permits a number of lamps to be provided onto a printed circuit substrate, each lamp or separate groups being independently addressable and having different colors or brightness characteristics. Individually addressable lamps of the unit may be individually driven or may be powered by a single power supply.

In one aspect, the invention includes providing a supporting substrate of preselected size having conductive traces for energizing electroluminescent lamps. A plurality of electroluminescent lamps, each lamp smaller than the supporting substrate, are placed and secured in flat form face-to-face (flat surface to flat surface) at preselected positions upon the supporting substrate and are electrically connected to the conductive traces of the supporting substrate. (The face-to-face engagement may involve either the front face or the back face of the electroluminescent components, depending upon the particular construction employed).

In another aspect, the invention provides an electroluminescent lamp unit by the following steps. A deformable supporting substrate of preselected size and having a first flat configuration and conductive traces for energizing an electroluminescent lamp is provided. At least one sheet-form flexible electroluminescent lamp is placed face-to-face in a preselected position upon and secured to the supporting substrate and is electrically connected to the conductive traces. The supporting substrate and secured sheet-form lamp are then deformed into a desired configuration for use.

In another aspect of the invention, the supporting substrate is flexible and after securing at least one sheet-form electroluminescent lamp to the substrate the supporting substrate and secured lamp are deformed into a desired configuration.

In another aspect, a method of constructing a three dimensional illuminating object comprising, forming a lamp member by providing upon a generally sheet-form, light-transmitting thermoplastic carrier substrate an electroluminescent lamp comprised of a thin film transparent electrode deposited on the carrier substrate and, thereon, a plurality of intimately bonded superposed thermoplastic layers including a layer containing phosphor particles that forms a phosphor layer, an insulative layer and a back conductive electrode layer, placing the lamp member over a die of desired three dimensional shape, and pressure forming the lamp member by pressing the lamp member against the die to form the lamp member to the desired three dimensional shape under conditions maintaining the operational integrity of the carrier substrate and the thermoplastic layers to produce a formed shape capable of emitting light.

Embodiments of the invention include the following aspects. The step of electrically connecting the lamp to the conductive traces and securing the lamp to the supporting substrate is accomplished by a single step. The lamp has exposed conductive leads which are ultrasonically welded to the conductive traces of the supporting substrate. The sheet-form lamp is electrically connected to the supporting substrate with a mechanical device (e.g. mechanical eyelet) placed through the combined thickness of the lamp and substrate. The sheet-form electroluminescent lamp includes a strain relief and the desired final configuration of the deformed substrate and secured lamp is a complex shape.

Where multiple lamps are employed, a first one of the electroluminescent lamps has a light emitting characteristic (e.g. color, intensity) that is different than a light emitting characteristic of a second one of the electroluminescent lamps.

In constructing a three dimensional illuminating object comprising a formed lamp member, the carrier substrate is a biaxially oriented sheet and may be a polyester or a polycarbonate material and the thermoplastic layers are comprised of polyvinylidene fluoride. Prior to pressure forming the lamp member, the lamp member is heated to a molding temperature below the glass transition temperatures of the thermoplastic of the carrier substrate and of the thermoplastic of the superposed layers and thereafter the lamp member is cooled in the molded three-dimensional form. The molding temperature is below a temperature at which substantial shrinking of the carrier substrate occurs. The molding temperature is in the range between 190° F. and 270° F. and is preferably between 230° F. and 260° F.

In general, the achievement of a single overall lamp module that is practical and inexpensive to manufacture, and which selectively emits various qualities of light at freely selectable locations is a particularly important practical achievement of the present invention. Another important achievement is the practical achievement of three-dimensional electroluminescent lamps and structures carrying such lamps.

Other advantages and features of the invention will become apparent from the following description and from the claims.

DRAWINGS

FIGS. 3A–3D are cross sectional side views of a surface mounted lamp being bonded to a substrate.

FIGS. 4A–4B are top views of surface mounted lamps bonded to a substrate.

FIGS. 14B–14C are cross-sectional side views of the electroluminescent lamp taken along lines 14B—14B and 14C—14C, respectively of FIG. 14A.

DETAILED DESCRIPTION

Figure 1:
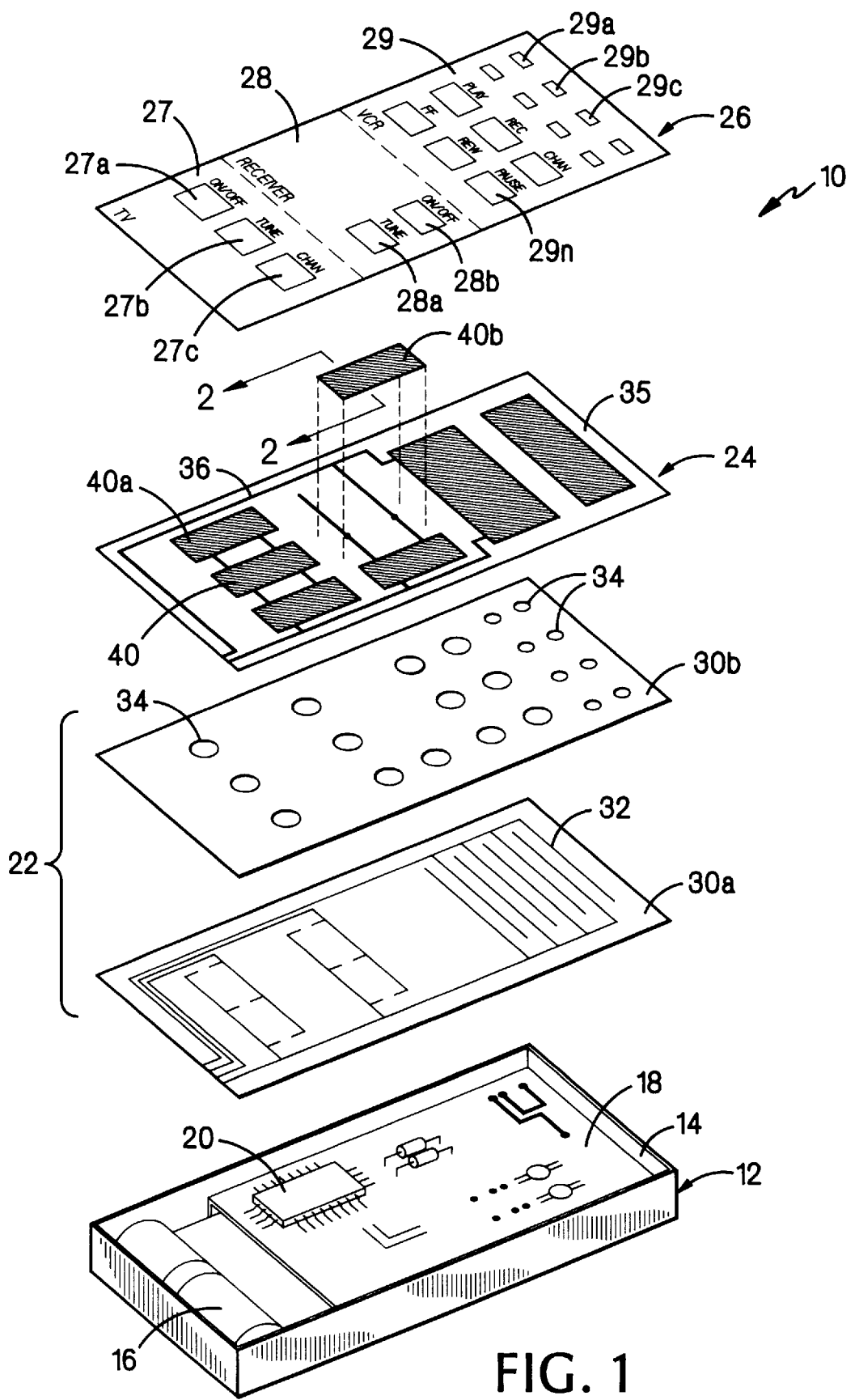
FIG. 1 is an exploded view of a hand-held remote control unit having surface mounted electroluminescent lamps according to the invention.

Referring to FIG. 1, a hand-held remote control device 10 for controlling a number of audio/visual instruments (e.g. television, VCR, stereo receiver) includes a housing 12 having a cavity 14 supporting a battery 16 and a control board 18. Control board 18 includes components 20 used to distribute power and signals for generating an infrared control signal to be received by the instruments. In addition, a switch keypad 22, a modular lamp circuit 24, and a graphics panel 26 are disposed within cavity 14 in vertical succession. Graphics panel 26 includes a graphic having areas 27, 28, 29 associated with each controlled component. Each area 27, 28, 29 further has regions 27a–27n, 28a–28n, 29a, 29n designating particular functions (e.g. on/off, volume, channel select) associated with the component designated for that area. A bezel (not shown) may be used to secure the graphics panel 26 to housing 12. With this arrangement, remote control unit 10 has an illuminated tactile membrane keypad operated by depressing regions associated with a selected audio/visual instrument.

Switch keypad 22 includes a flexible polyester board 30a having conductive traces 32 connected to control board 18 with a switch board 30b disposed thereon. Switch board 30b includes shorting switches 34, each switch corresponding to a particular function of a particular component and positioned over a region of circuit board 30a such that application of a downward force on the switch effectively "shorts" traces 32 corresponding to a particular function.

Modular lamp unit 24 produced using techniques of the present invention is disposed between switch keypad 22 and graphics panel 26 and includes a flexible printed circuit substrate 35 having conductive traces 36 of conductive ink upon which a number of flexible electroluminescent lamps 40 have been placed. Each electroluminescent lamp 40 has a pair of conductive pads 41a (FIG. 4A) formed by conductive ink deposits on the plastic substrate. These conductive pads provide electrical connection points to conductive traces 36 leading to power and ground buses. Portions of conductive traces 36 that are not connection points to conductive pads 41a of lamps 40, are generally covered with a dielectric layer to provide electrical isolation, reduce silver migration, and to provide moisture protection. One method of providing such a dielectric layer is to screen print a UV curable ink, for example, Product No. 5014, manufactured by E.I. DuPont de Nemours & Co., Wilmington, Del., over portions of conductive traces 36 on flexible substrate 35. Flexible substrate 35 is made from a polyester based material, model no. ST505, a product of ICI Corp., Wilmington, Del. having a thickness of about 0.007 inches and a surface with a coating of indium tin oxide subsequently applied.

Figure 2:
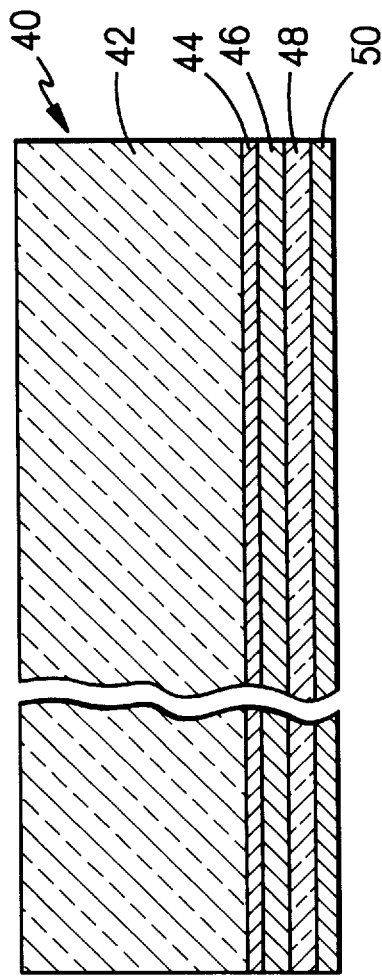
FIG. 2 is a cross sectional side view taken along lines 2—2 of FIG. 1.

Referring to FIG. 2, an exemplary electroluminescent lamp 40 is shown. It is limited in size to a specific area to be illuminated and comprises a number of layers beginning with a transparent substrate 42, (e.g., a sheet of polyester film approximately 0.007 inches thick). Substrate 42 has on one side a pre-applied coating of a transparent conductive material, preferably, indium tin oxide (ITO), although aluminum oxide, gold and silver or other composite coatings may also be used. The ITO material is preferably vacuum sputtered onto the substrate panel to form a transparent front coating 44 that is approximately 1000 Å thick. Transparent front coating 44 is covered with a phosphor layer 46 formed of electroluminescent phosphor particles, e.g., zinc sulfide doped with copper or manganese which are dispersed in a polymeric binder. Phosphor layer 46 is applied to the front transparent coating 44 by screen printing and has a thickness of approximately 0.001 inches. A dielectric layer 48, approximately 0.001 inches thick, is formed of a high dielectric constant material, such as barium titanate dispersed in a polymeric binder. Dielectric layer 48 is screen printed over phosphor layer 46 so that it extends to the edges of the lamp 40. Deposited over the dielectric layer 48 is a rear electrode 50 formed of conductive particles, e.g., silver, or carbon, dispersed in a polymeric binder to form a screen printable ink. The ink is screen printed onto dielectric layer 48 to form rear electrode 50 in a layer approximately 0.0005 inches thick. In some applications of lamp 40, an additional insulating layer (not shown) may be applied over rear electrode 50 to prevent possible shock hazard or to provide a moisture barrier to protect the lamp. A suitable polymeric binder for these layers is PVDF as described in U.S. Pat. No. 4,816,717, incorporated herein by reference.

Referring again to FIG. 1, each of the pre-formed electroluminescent lamps 40 is positioned between particular shorting switches 34 of switch keypad 22 and corresponding areas 27, 28, 29 of graphics panel 26. The flexible nature of lamps 40 permits the downward force applied to cover plate 26 to be transferred to shorting switches 34 without damaging lamps 40. In this embodiment, electroluminescent lamps 40 associated with particular regions of graphics panel 26 have different selected colors. For example, area 27 associated with television functions is illuminated with an electroluminescent lamp 40a emitting orange light while area 29 associated with controlling a video cassette recorder (VCR) is illuminated with lamp 40b emitting blue light.

Referring to FIGS. 3A–3D, a process for bonding the small pre-formed electroluminescent lamps 40 to the flexible substrate 35 of the modular unit is shown.

Figure 3A:
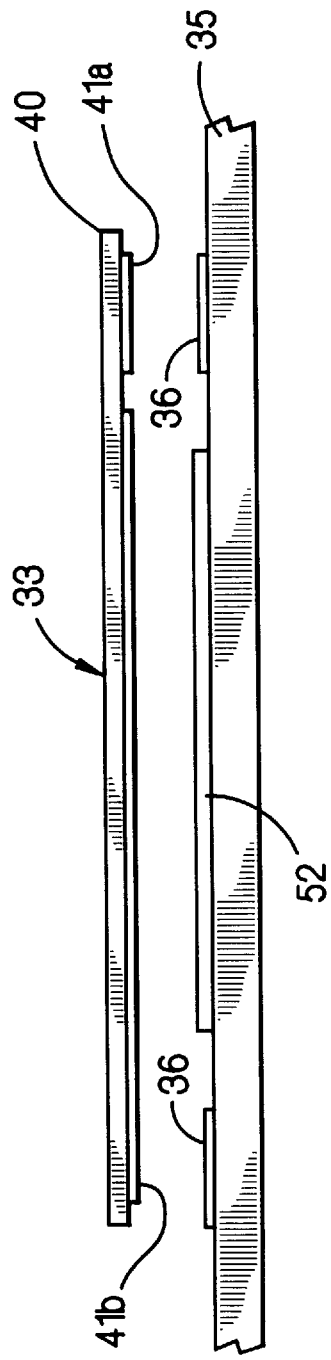

As shown in FIG. 3A, lamp 40 with lit side 33 facing up is positioned on flexible substrate 35 such that conductive pads 41a, 41b of the lamp are superposed over traces 36 of the substrate. A small drop of adhesive or as shown here, a double-sided pressure sensitive adhesive strip 52 is placed between flexible substrate 35 and rear electrode 50 of lamp 40 at a region between conductive pads 41a, 41b to lightly fasten lamp 40 to flexible substrate 35. Referring back to FIG. 2, conductive pad 41b is directly connected to rear electrode 50 while conductive pad 41a is connected to transparent front coating 44 through a via hole (not shown). Adhesive strip 52 permits the lamp 40 and flexible substrate 35 combination to be flipped over during the course of manufacture such that lamps 40 are beneath the board for reasons as explained below.

Figure 3B:
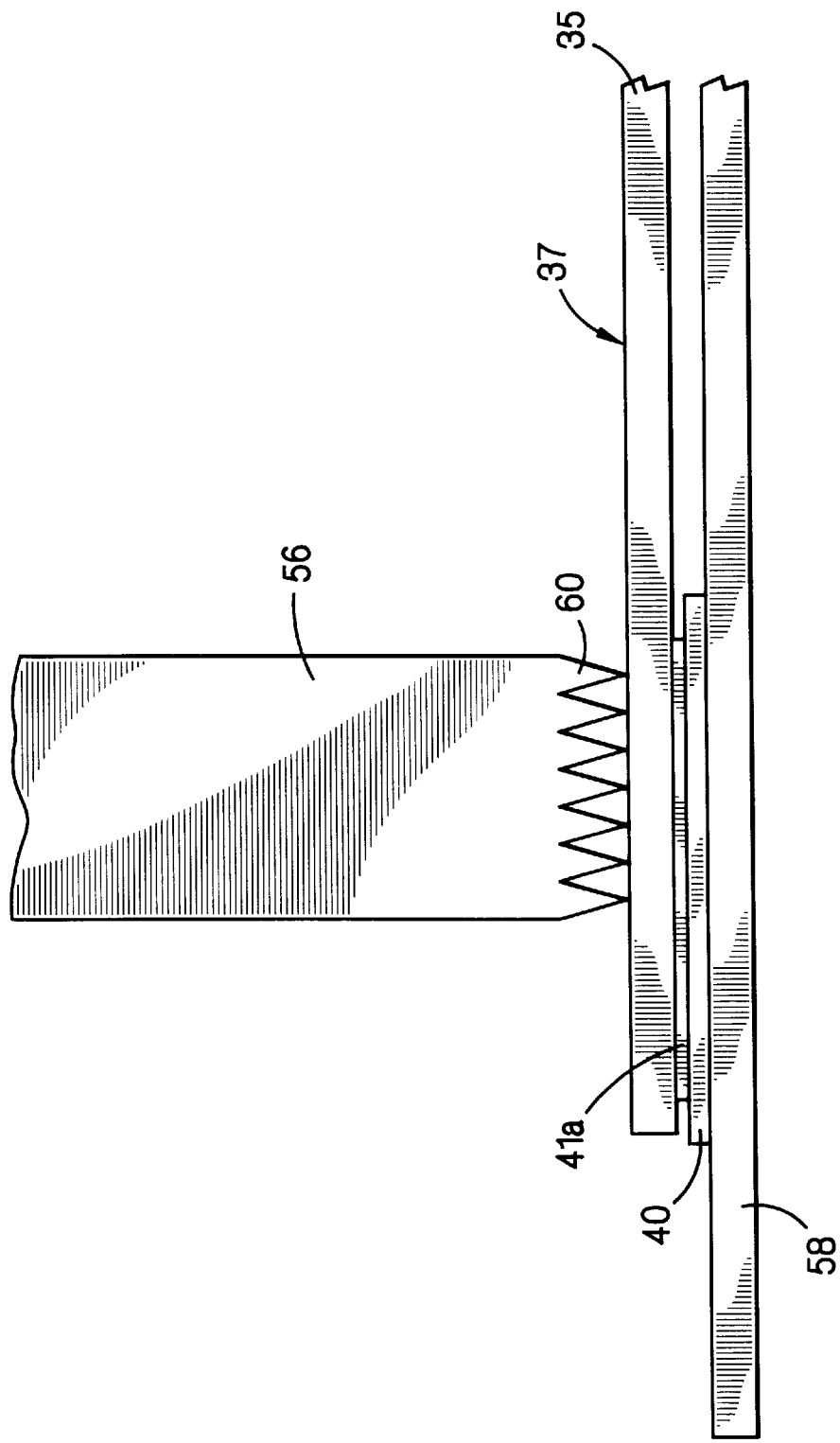

Referring to FIG. 3B, lamp 40 is electrically and mechanically bonded to flexible substrate 35 using an ultrasonic welder 54 (FIG. 5), such as Model 901AE IW Integrated Welder, manufactured by Branson Ultrasonics Corp., Danbury, Conn. As described above in conjunction with FIG. 3A, the lamp 40 and flexible substrate 35 combination may be flipped over and provided to welder 54 so that an under surface 37 of flexible substrate 35 faces a knurled welding tool 56 positioned above the region of conductive pad 41a of lamp 40. Knurled welding tool 56 has a diameter of about 0.25 inches and a tip having a grid array of relatively sharp prongs 60 approximately 0.020 inches long and spaced from each other by 0.030 inches. With this arrangement, transparent coating 44 of lamp 40 is face down on an X-Y base plate 58 of welder 54. Welder 54 is electronically programmed to position welding tip 56 over a plane parallel with base plate 58.

As shown in FIG. 3C, welder 54 is programmed to lower knurled welding tool 56 to undersurface 37 with a predetermined force and for a precise duration of time so that prongs 60 penetrate through flexible substrate 35 and into lamp 40. Prongs 60 extend through rear electrode 50, phosphor 46 and into transparent substrate 42 of lamp 40. As is known by those in the art, vibration welding is a technique for producing strong structural or high-pressure seals between thermoplastic materials. High frequency electrical energy (20 kilohertz) is provided by a solid state power supply to a converter unit (not shown) of welder 54. The converter unit changes the electrical energy into mechanical vibratory energy at ultrasonic frequencies. The vibratory energy is transmitted to the joint area through welding tool 56 and is converted to heat at the prongs of the tool through friction. In this embodiment, the undersurface 37 of flexible substrate 35 is vibrated against the rear electrode 50 of lamp 40 under a pressure of 10–20 lbs/in$^2$, for 25–75 milliseconds. Frictional heat generated at the interface area causes the polyester material of flexible substrate 35 and transparent substrate 42 to fuse such that a strong molecular bond is provided therebetween.

Figure 3D:
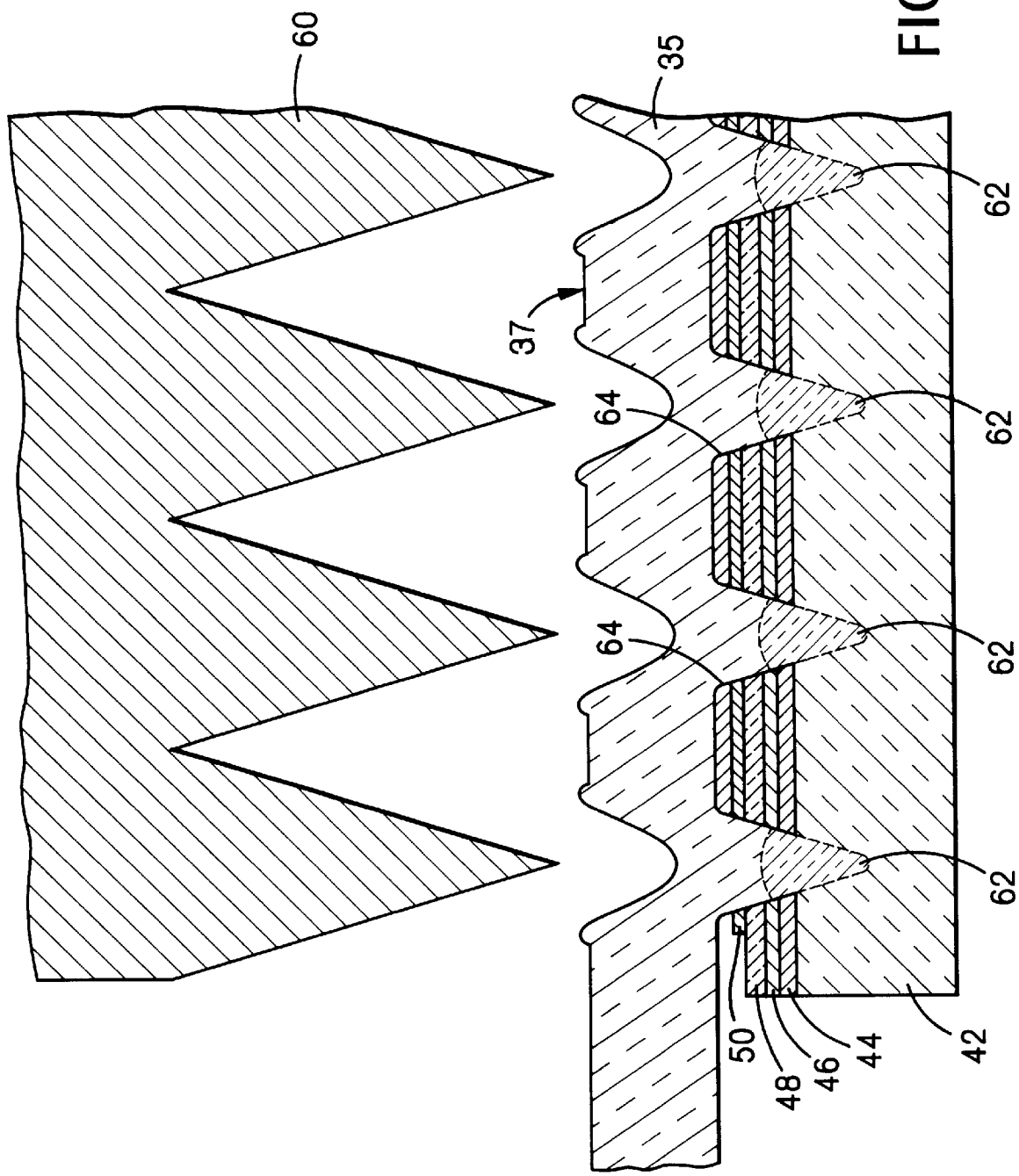

Referring to FIG. 3D, to complete the weld operation, knurled welding tool 56 is lifted away from flexible substrate 35 leaving behind mechanical contact points 62 of fused polyester of flexible substrate 35 and transparent substrate 42 of lamp 40. The weld strength of mechanical contact points 62 approaches that of the parent material. Concurrently, the localized heat and vibration provided by the knurled welding tool 56 forces the screen printable conductive polymeric ink of rear electrode 50 away from the penetration locations to form electrical contact paths 64 between mechanical contact points 62, so that electrical continuity is assured.

Figure 4A:
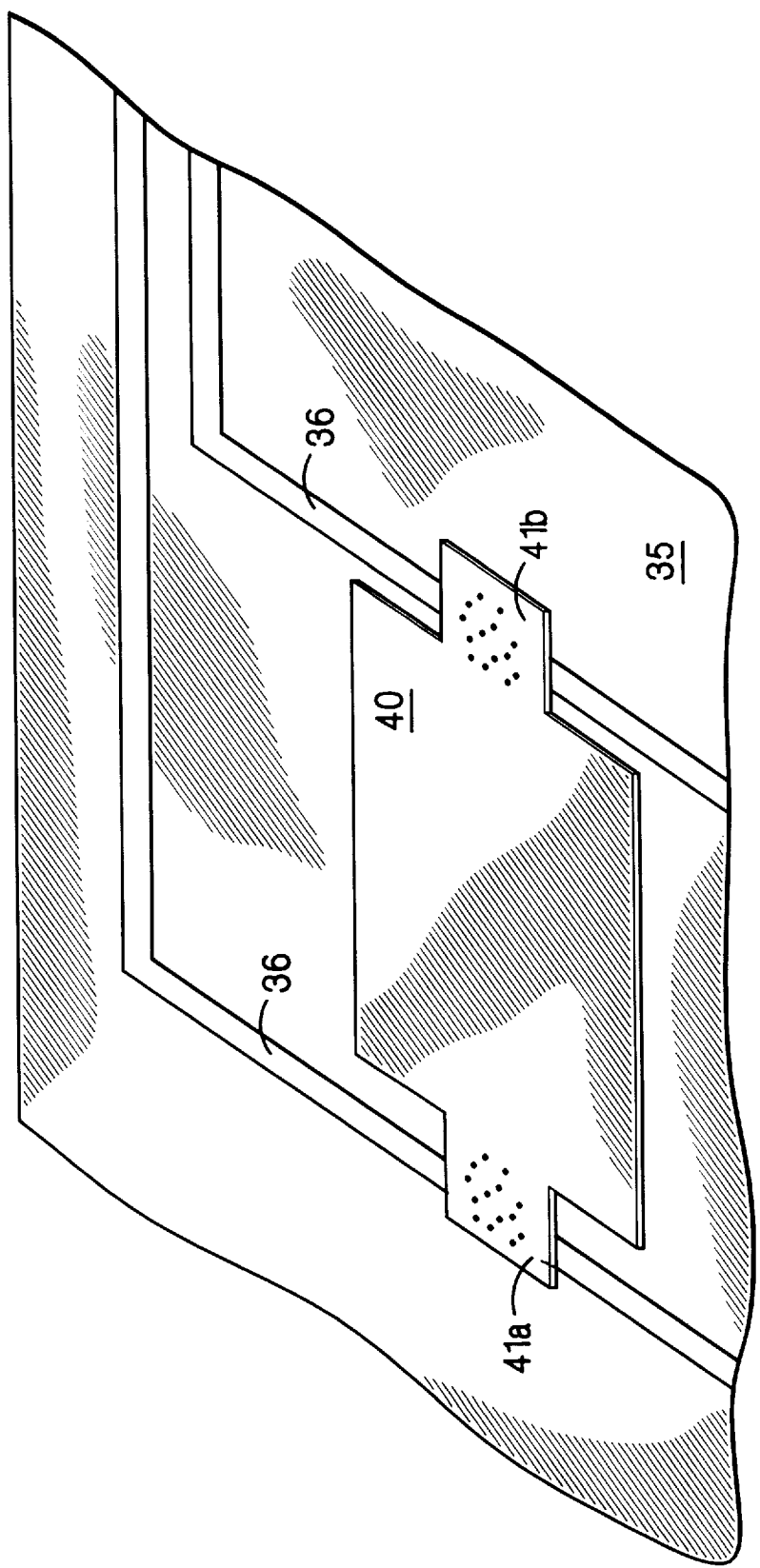

Referring to FIGS. 4A and 4B, lamp 40 is shown having a pair of conductive pads 41a attached to conductive traces 36 of flexible circuit 35. The grid arrangement of prongs 60 of welding tool 56 is used to provide the grid of fused mechanical contact points 62 and conductive ink to conductive ink electrical contact paths 64 between printed rear electrode 40 and printed conductive traces 36. A line of interruption 69 is laser scribed through rear electrode 50 to provide electrical isolation between the rear electrode 50 and front electrode 44. Electrical isolation is provided because connection of rear electrode 50 to flexible substrate 35 as described in FIGS. 3A–3D (or when using methods described below) can cause front electrode 44 to short with rear electrode 50.

Figure 9:
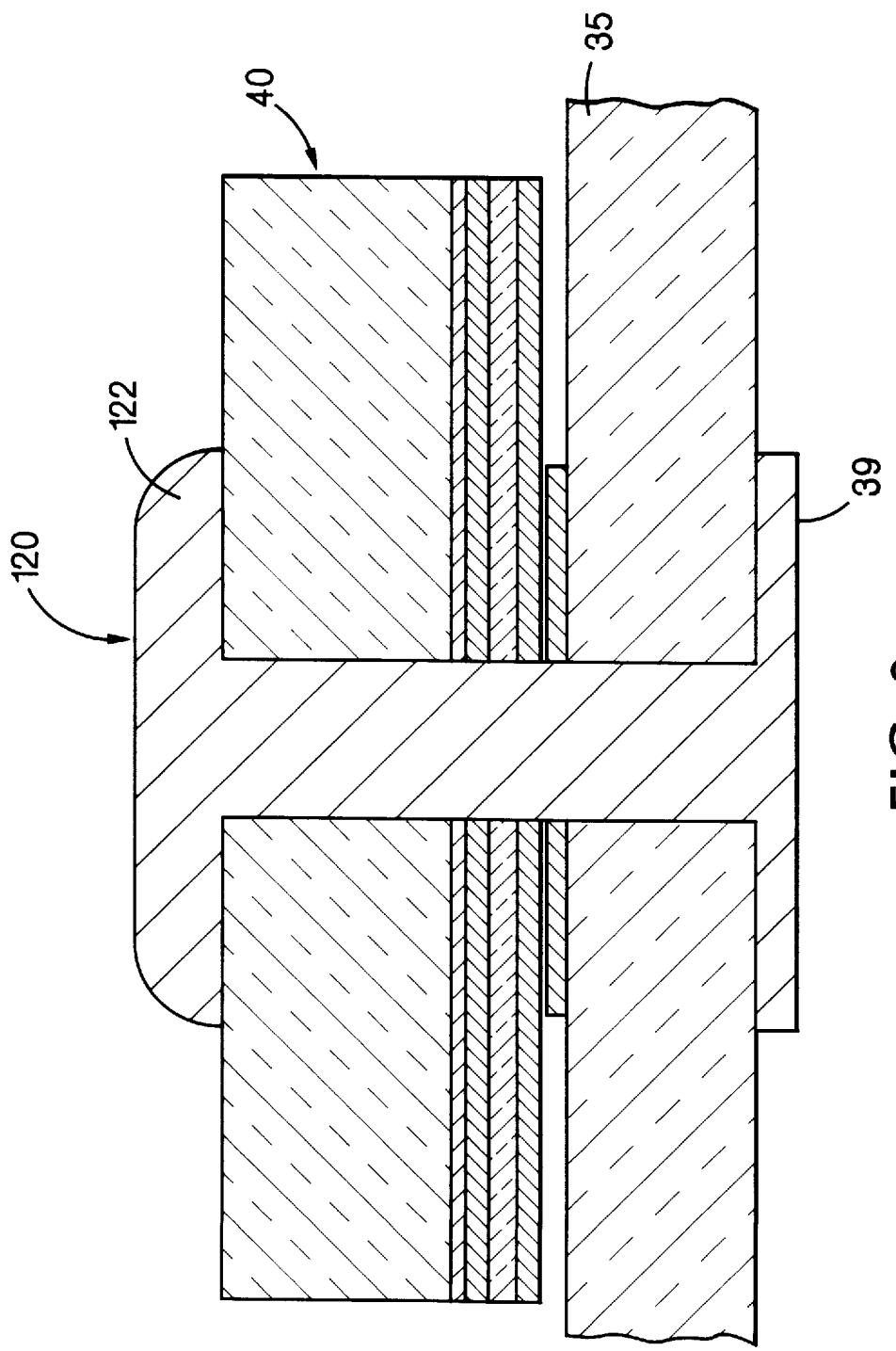
FIG. 9 is a cross-sectional view of a surface mounted lamp attached to a flexible substrate using a mechanical eyelet.
Figure 10:
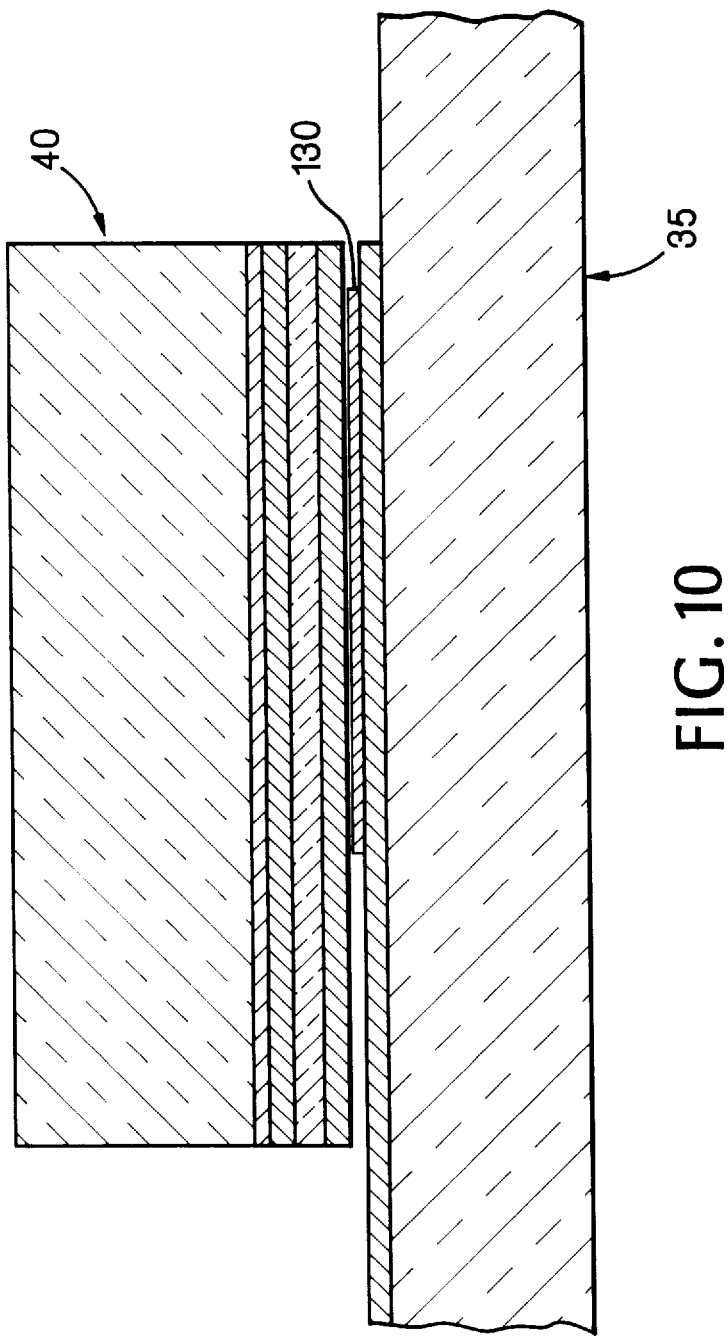
FIG. 10 is a cross-sectional view of a surface mounted lamp attached to a flexible substrate using an adhesive strip.

It is appreciated that the small, pre-formed lamps 40 may be connected to flexible substrate 35 using other attachment means. Referring to FIG. 9, for example, a mechanical eyelet 120 is shown having a headed pin portion 122 that is disposed through lamp 40 and flexible substrate 35 and flattened at a bottom surface 39 of substrate 35 to fasten lamp 40 firmly to the substrate. Alternatively, as shown in FIG. 10, a strip of strong conductive adhesive film 130, such as Model No. 9703, a product of 3M Corporation, Minneapolis, Minn. is used to securely fix lamp 40 and substrate 35.

Figure 5:
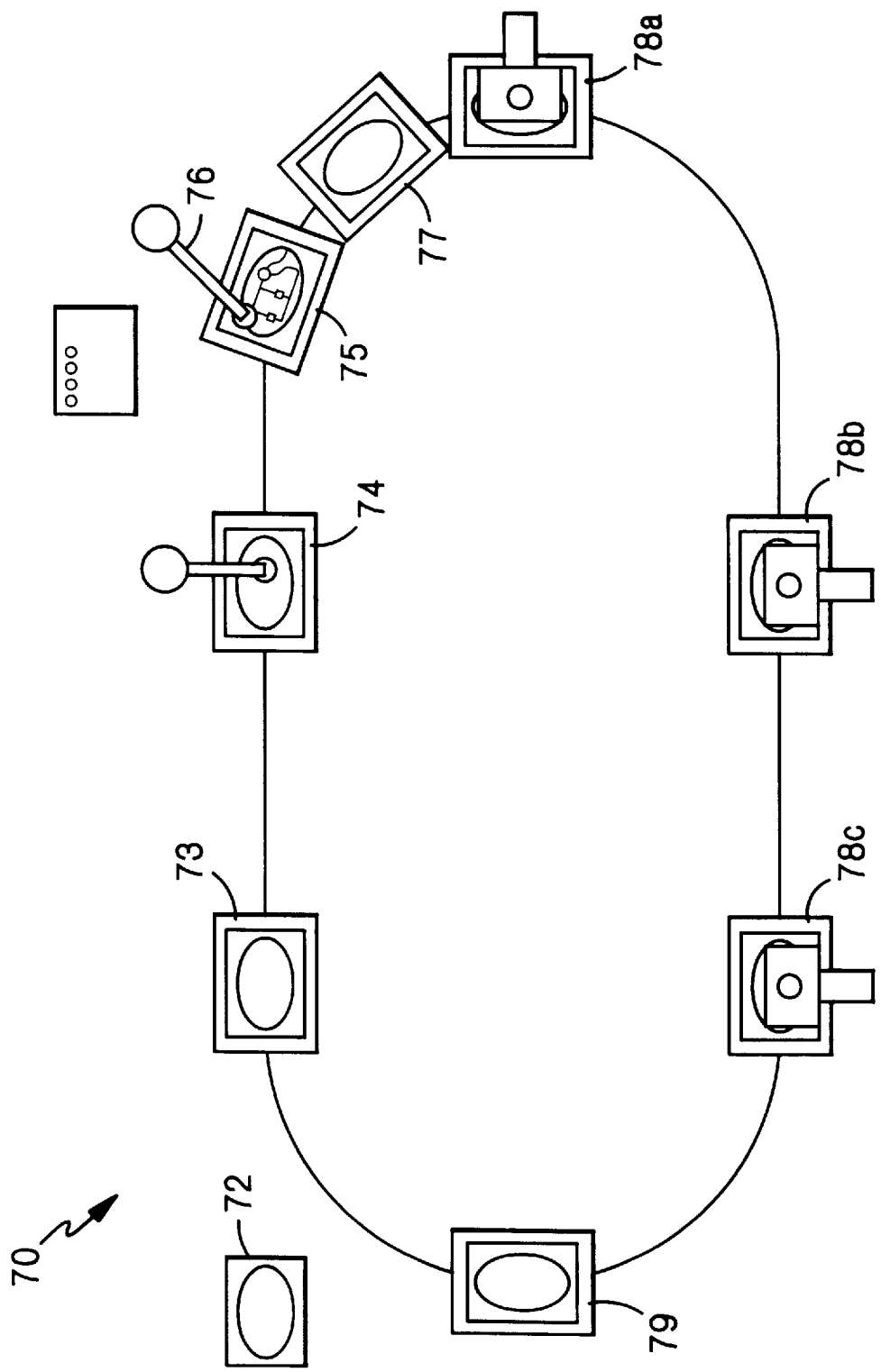
FIG. 5 is a plan view of a surface mounted lamp assembly station.

The process of securing preformed lamps 40 of selected small size to flexible substrate 35 is advantageously adapted for use in an automated production line environment. Referring to FIG. 5, an automated lamp mounting assembly line 70 is supplied an inventory of flexible substrates 35 having predetermined conductive traces 36 and predetermined areas for securing lamps 40. Flexible substrates 35 are conveyed along a line past a series of production stations. At a preparation station 72, for example, substrates 35 are cleaned and prepared for receiving lamps 40 before being conveyed to loading station 73. Each substrate 35 is generally supported on a rigid template to provide support to the flexible substrate as it moves from station to station and to provide registration for the welding procedure. Assembly aides such as adhesive tape 52, 130 (described in conjunction with FIGS. 3A and 10) or epoxy adhesives are placed at appropriate locations on flexible substrate 35 at an adhesive dispensing station 74. Dispensing station 74 here, includes a syringe that is controlled to dispense a "dot" of quick-drying epoxy, sufficient for supporting a lamp 40, onto an area of the lamp removed from conductive pads 41a.

Lamps 40 are placed on substrates 35 in a "pick and place" fashion at a numerically controlled lamp-mounting station 75 having a robot arm 76. A wide variety of lamps 40 having different sizes, colors, and intensities are supplied from selection trays or from a spool of flexible electroluminescent lamps. A bill of instructions defining the number, type, and position of lamps 40 to be bonded to flexible substrate 35 is provided to assembly line 70 to instruct robot arm 76 to select and properly position lamps 40 on flexible substrate 35. The robot arm 76 uses a vacuum pick up mechanism to retrieve lamp 40 having uncured epoxy applied thereto, positions, and presses the lamp for a sufficient time to allow the epoxy to partially cure and returns to retrieve a next lamp.

For certain modular lamp assemblies, it may be necessary to use a flip station 77 to turn the flexible substrate/lamp combination over so that underside 37 (rear electrode 50) is presented face up to a series of welding stations 78a–78c. In such applications, the template is used to flip over flexible circuit 35.

Each one of welding stations 78a–78c operate as described above in conjunction with FIGS. 3B–3D to mechanically and electrically secure a particular lamp 40 to the flexible substrates 35 at a preselected position. In an alternate arrangement, a single welding station having a numerically controlled robot arm may be used to perform welding operations for all of the lamps 40 positioned on substrate 35.

Finally, completed modular lamp units are conveyed to an unload station 79 where they may be cleaned, inspected, tested and packaged for delivery.

Figure 6:
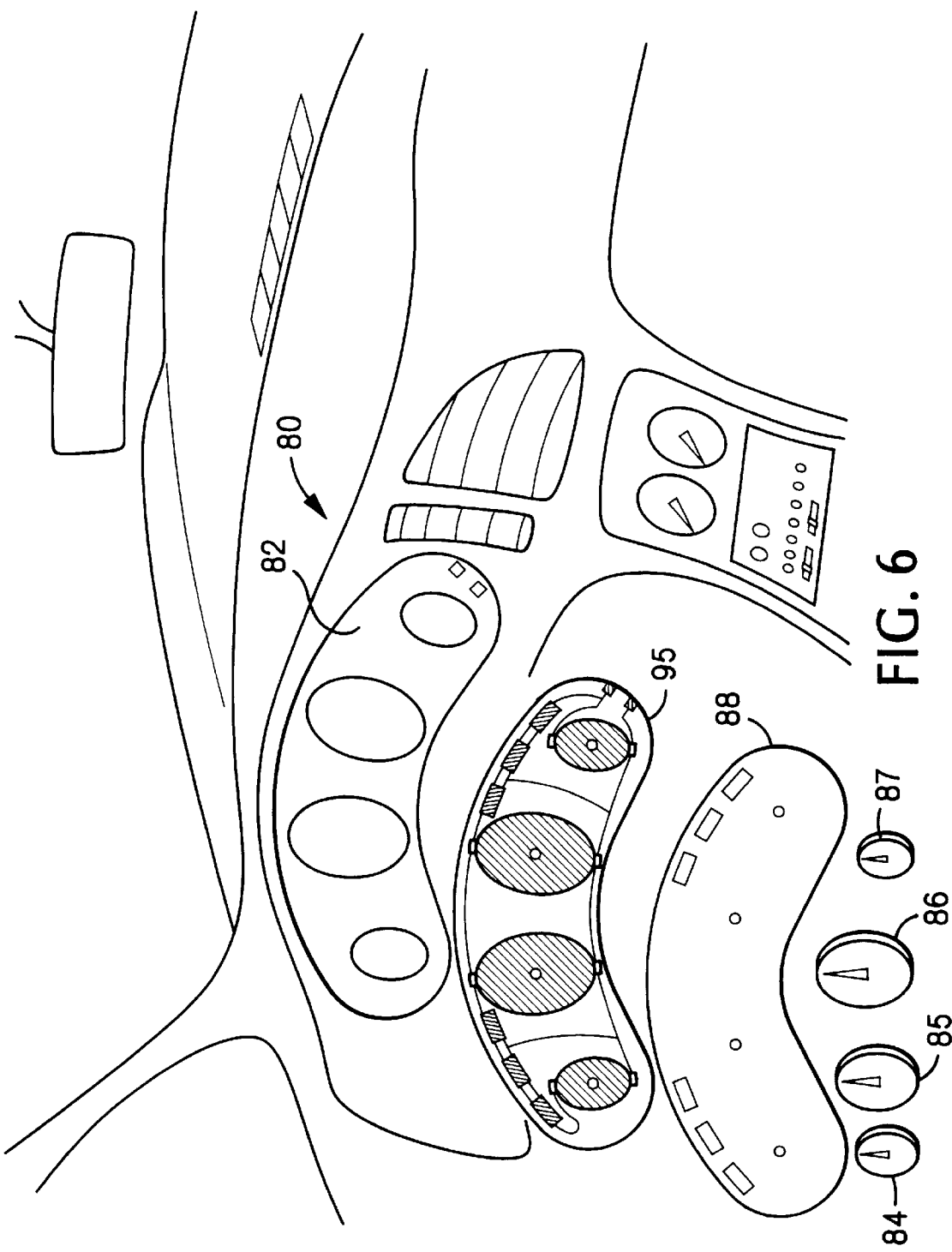
FIG. 6 is another embodiment having surface mounted lamps according to the invention.

Other embodiments are within the scope of the claims. For example, referring to FIG. 6, the interior of an automobile is shown to include an automobile dashboard 80 having an instrumentation mount 82 for supporting a dash panel 88 and gauges 84–87. Instrumentation mount 82 has a concave shape conforming with the curved dashboard of the stylized automobile cockpit. Gauges 84–87 include, for example, speedometer, tachometer, temperature, and fuel gauge functions. Dash panel 88 includes a printed graphic for warning indications 89–94, such as seat belt, open door/trunk, high beam headlight and alternator functions.

Figure 7:
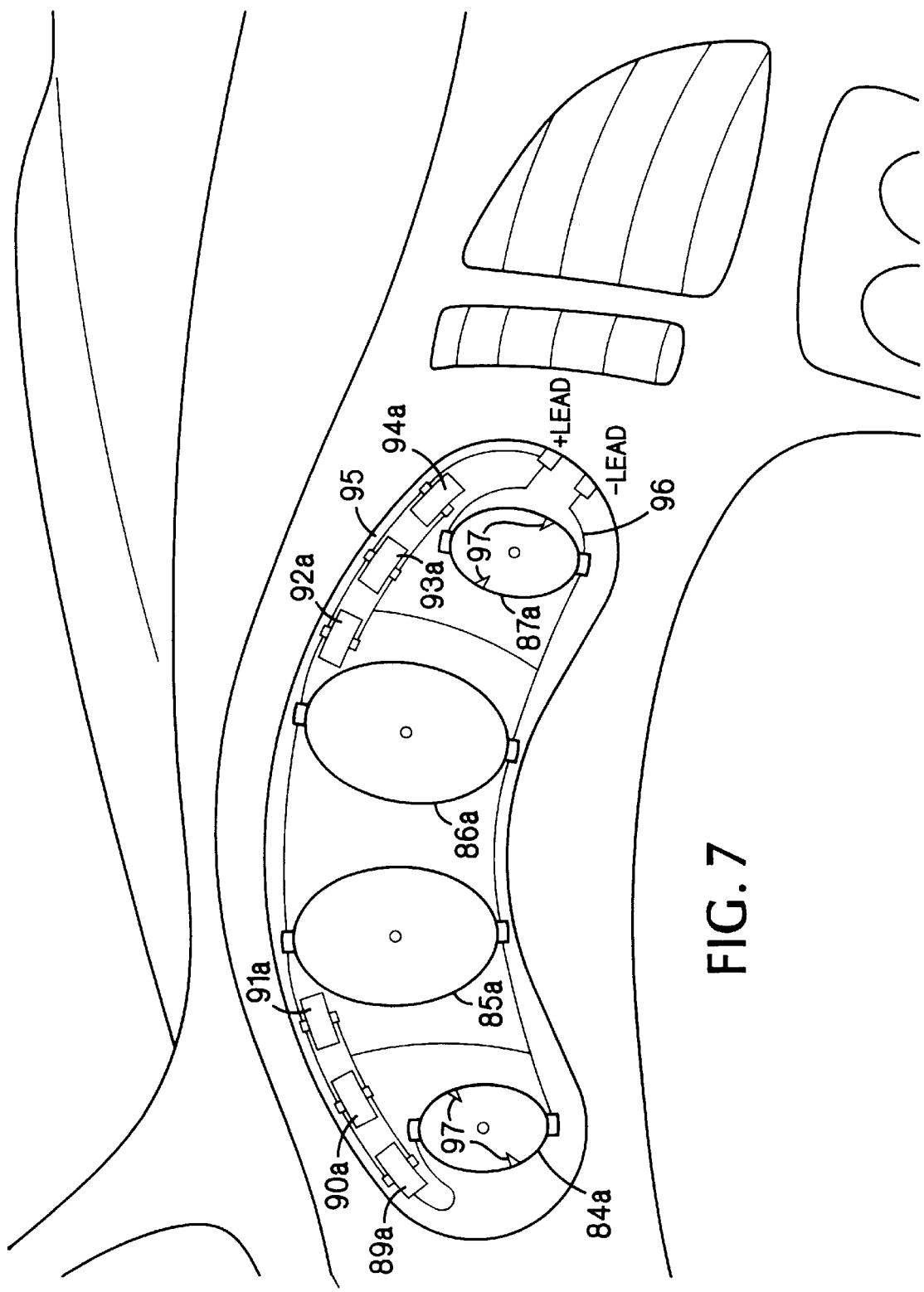
FIG. 7 is an enlarged view of the flexible circuit of FIG. 6.

Referring to FIG. 7, a pre-formed, flexible multi-lamp module unit manufactured in the manner described above is positioned within instrumentation mount 82 and behind both gauges 84–87 and dash panel 88. Flexible circuit 95 of the module is shown carrying electroluminescent lamps 84a–87a and 89a–94a connected with conductive traces 96 of the substrate to an electrical power source (not shown). Electroluminescent lamps 84a–87a and 89a–94a have sizes and shapes conforming with corresponding gauges 84–87 and warning indications 89–94 to be illuminated. Each electroluminescent lamp 84a–87a and 89a–94a is independently addressable and where appropriate is connected to a switch for connecting the lamp to the power source when a particular fault (e.g., seat belt unfastened) is detected. The multi-lamp flexible module may be deformed or flexed to the extent that regions having small radii of curvature exist. In these regions, flexible circuit 95 and attached lamps 84a, 87a may include strain relief incisions 97 to reduce bending stress 40 on lamps 84a, 87a and flexible circuit 95.

In another embodiment, not shown, the multi-lamp flexible module unit shown in FIG. 7 may be formed by employing, as a carrier substrate, a relatively thick self-supporting substrate of thermoplastic which, after manufacture in the flat, is formed by application of pressure and heat with lamps in place into a desired configuration.

In the case of forming the lamps themselves into three-dimensional objects, it is found advantageous to employ a process we refer to as "thermalforming". Thermalforming is distinguishable from the well-known process of thermoforming in which a plastic film is heated to its glass transition temperature and allowed to sag, before drawing it over or into a die by vacuum and/or pressure. Thermalforming is a very different process that is conducted at lower, controlled temperatures below the glass transition temperature, in which pressure forming action is employed to conform the lamp to a mold without disturbing the operational integrity of the layers of the lamps. Thus, the lamp, in its new three-dimensional form, can still function as a lamp. For example, certain types of electroluminescent lamps such as the Durel-3™ electroluminescent lamp, manufactured by Durel Corporation, Tempe, Ariz., are fabricated on a carrier substrate comprising a biaxially oriented polyester film which is found to be conducive for being thermalformed into a wide variety of three dimensional configurations. Alternatively, such electroluminescent lamps may be provided on polycarbonate films. Generally, the temperature limits for thermalforming lamps provided on such substrates is between 190° F. and 270° F., with a preferred range between 230° F. and 260° F. The upper limit is limited by the temperature at which the thermoplastic layers of the electroluminescent lamp are damaged and further, in the case of oriented polymeric substrates, by the temperature at which the carrier substrate is subject to shrinking. The thermoplastic layers of the lamp are generally comprised of polyvinylidene fluoride and include a layer containing phosphor particles for forming a phosphor layer, an insulative layer and a layer, e.g., containing conductive particles, for forming a back conductive electrode. It is important to note that the range of temperatures suitable for thermalforming is well below the glass transition temperatures of polyester and polycarbonate. The lower temperature limit is established by the temperature required to permanently deform the lamp. Thermalforming at these relatively low temperatures maintains the integrity of the carrier substrate and thermoplastic layers. Specifically, the phosphor layer, after thermalforming, provides a uniform distribution of light across the lamp and reliable electrical continuity is maintained across the conductive layer. In addition, shrinkage of the carrier substrate is avoided during the thermalform process.

Figure 11B:
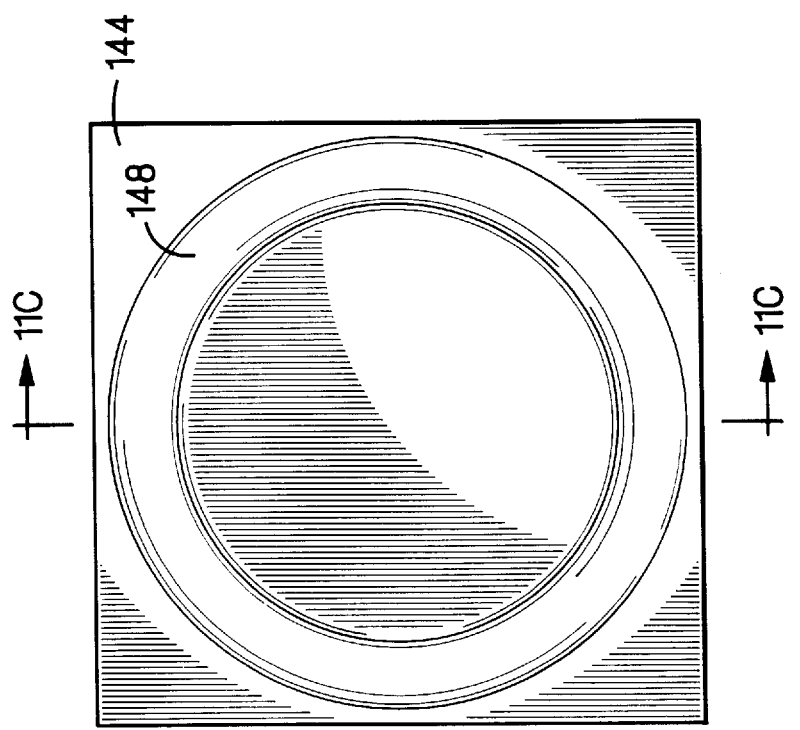
FIG. 11B is a top view of the formed electroluminescent lamp provided by the arrangement of FIG. 11A.
Figure 11C:
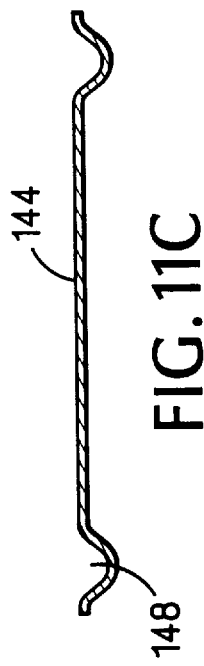
FIG. 11C is a side view of the formed electroluminescent lamp provided by the arrangement of FIG. 11A.
Figure 11A:
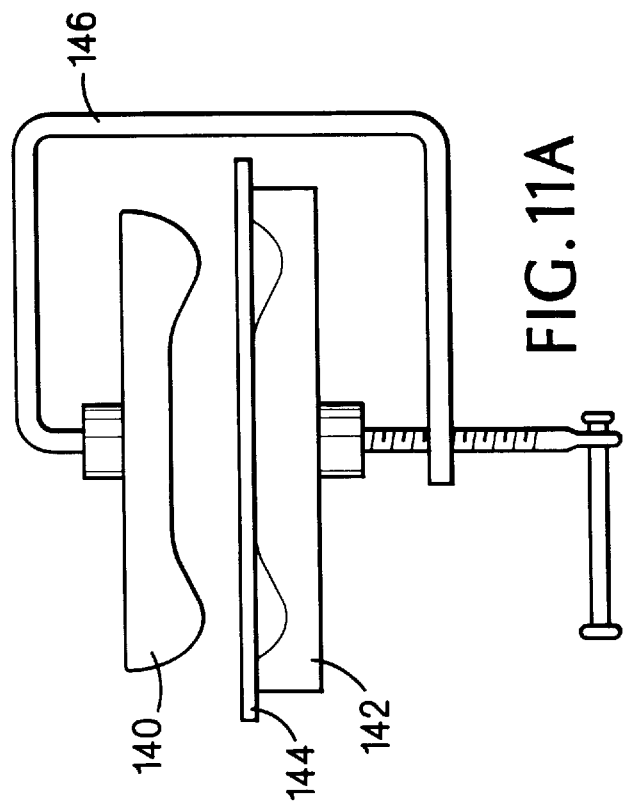
FIG. 11A is a side view of an arrangement for forming an electroluminescent lamp.

Referring to FIG. 11A, one method of thermalforming an electroluminescent lamp includes the heating of mated, male and female aluminum dies 140, 142 in an oven (not shown) to 250° F. A Durel-3 EL lamp 144 is placed between the dies 140, 142 and a "C" clamp 146 is used to provide slight pressure to hold the sandwiched parts together. The sandwiched lamp 144 and clamp 146 is returned to the oven at the same temperature for approximately eight minutes, is removed and the clamp 146 tightened. After 15 minutes of cooling, the clamp 146 is removed to provide the thermalformed lamp 144a. The thermalformed lamp 144 when attached to a power supply, illuminates with uniform lighting provided in both thermalformed and flat regions of the lamp. As shown in FIGS. 11B and 11C, the shape of aluminum dies 140, 142 provide lamp 144a with a circular groove 148 and was used to demonstrate the degree of thermal deformation that the lamp 144 can experience during thermalforming without impairing its function.

Figure 12A:
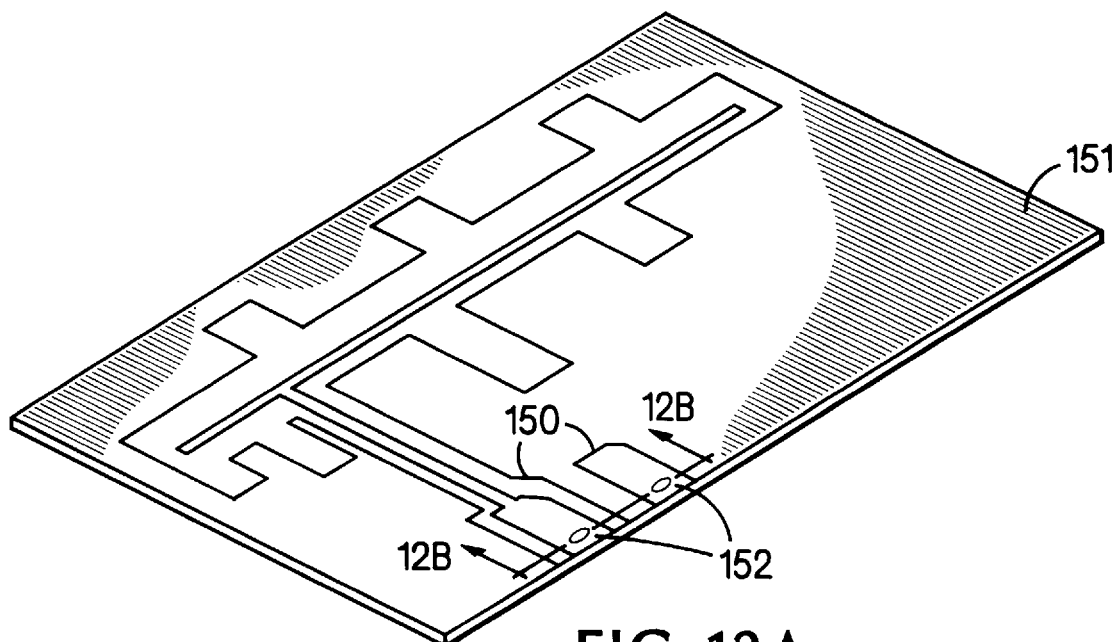
FIG. 12A is a perspective view of an electroluminescent lamp having molded spring detents.
Figure 12B:
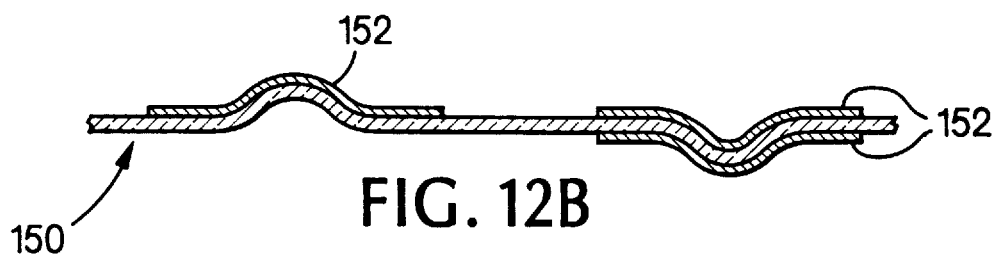
FIG. 12B is a cross-sectional side view of the electroluminescent lamp taken along lines 12B—12B of FIG. 12A.

In another application, shown in FIGS. 12A–12B, the planar pad portions 150 of a Durel 3 electroluminescent lamp 151 for supporting electrical contacts 152 are thermalformed in the manner described above in conjunction with FIGS. 11A–11C to provide spring detents. The pad portions are preferably deformed to be elevated above the plane of the surface of the electrode about 0.010 inch, although in certain applications 0.002 inches may be sufficient to provide the necessary spring effect. In applications where electrical power is provided to contacts on opposite surfaces of an electroluminescent lamp, conductive adhesives are typically used to maintain good electrical contact at the contact points. The spring detents provide constant pressure to the conductive adhesive at the connection point assuring electrical continuity to the lamp and its power source.

Figure 12C:
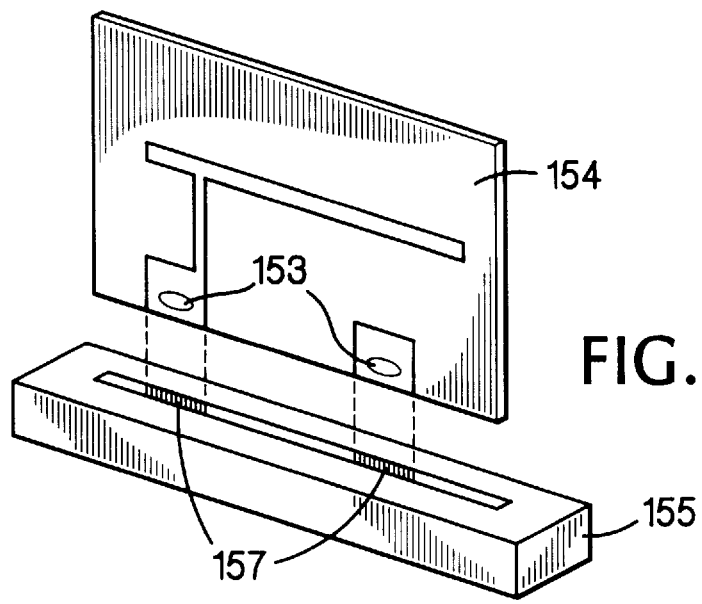
FIG. 12C is a perspective view of an electroluminescent lamp with molded spring detents for insertion into a mating receptacle.

In another embodiment, as shown in FIG. 12C, an electroluminescent lamp 154 has integral raised polymeric spring detents 153 thermalformed on contact pads for insertion into a receptacle 155. Receptacle 155 includes a mating connector having spring fingers 157 with a dimension slightly less than the height of detents 153. The spring detents 153 formed of the polymer of the lamp itself are compressed during insertion such that a wiping action is imparted between the contacts. It is appreciated that although FIGS. 12A–12B show the detents on opposite sides of the lamp, constructions with the detents on the same surface of the lamp are also possible.

Figure 13A:
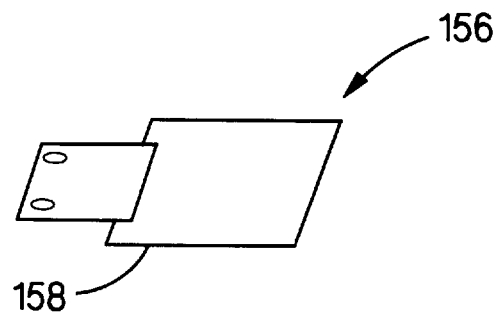
FIG. 13A is a side view of a variable light source electroluminescent lamp in its fully extended position.
Figure 13B:
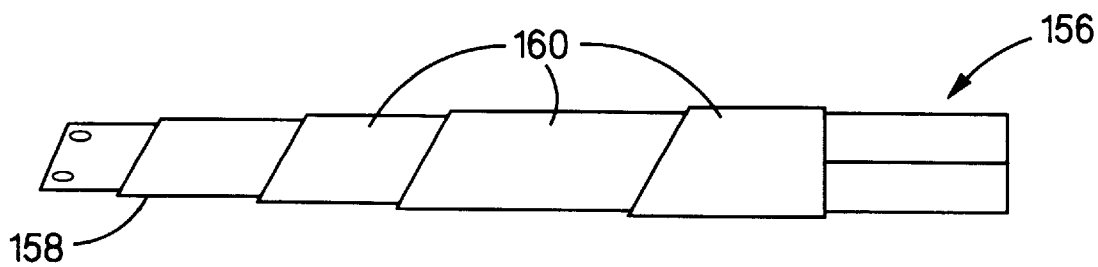
FIG. 13B is a side view of a variable light source electroluminescent lamp in its fully compressed position.
Figure 13C:
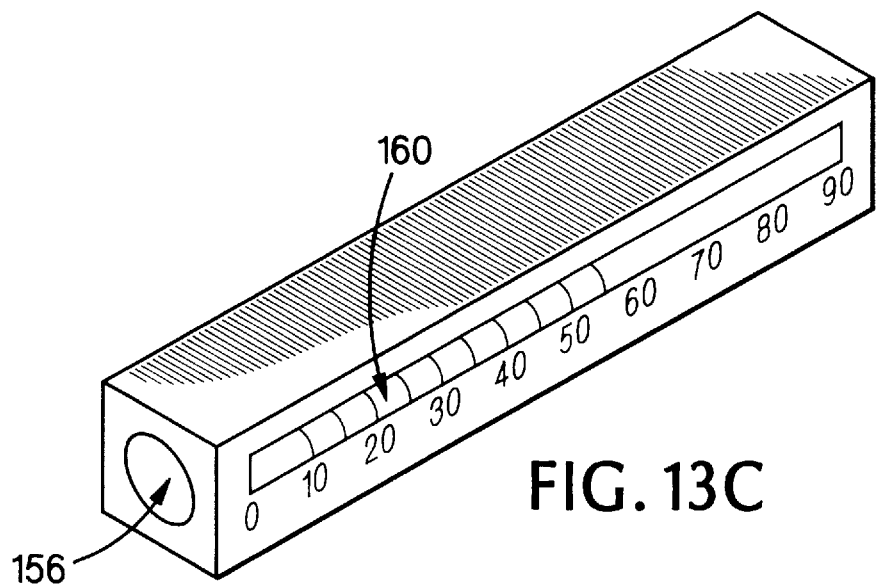
FIG. 13C is a perspective view of the variable light source electroluminescent lamp of FIGS. 13B and 13C used as an indicator in a speedometer.

In another embodiment, a thermalformed lamp may be constructed to provide a variable light output lamp 156. Referring to FIGS. 13A–13B, a one inch wide, eight inch strip 158 of Durel-3 EL lamp material is formed into a helical spiral of coils 160, adhesively clamped around a cylindrical mandrel and placed in a 250° F. thermal oven for 5 minutes. The clamped lamp material 158 is removed from the mandrel and allowed to cool for 7 minutes. Upon removal, the EL lamp 156 remains as a helical spring that can be compressed, but is biased to return to its elongated form. Referring to FIG. 13B, the EL lamp 156 when telescoped to its fully extended form, emits the maximum amount of light from the helical coils 160. Conversely, as shown in FIG. 13A, to reduce the light emitted, the helical coils 160 are compressed such that masking between the individual coils reduces the overall light emitted from the lamp 156. As shown in FIG. 13C, the variable light output lamp may be used for example in a automobile speedometer. In this embodiment, the variable light output lamp is mounted within the dash panel and is attached to the automobile's speedometer cable to provide the pressure necessary to permit the illuminated coils to elongate as the speed of the automobile is increased and shorten when the speed is decreased.

Figure 14A:
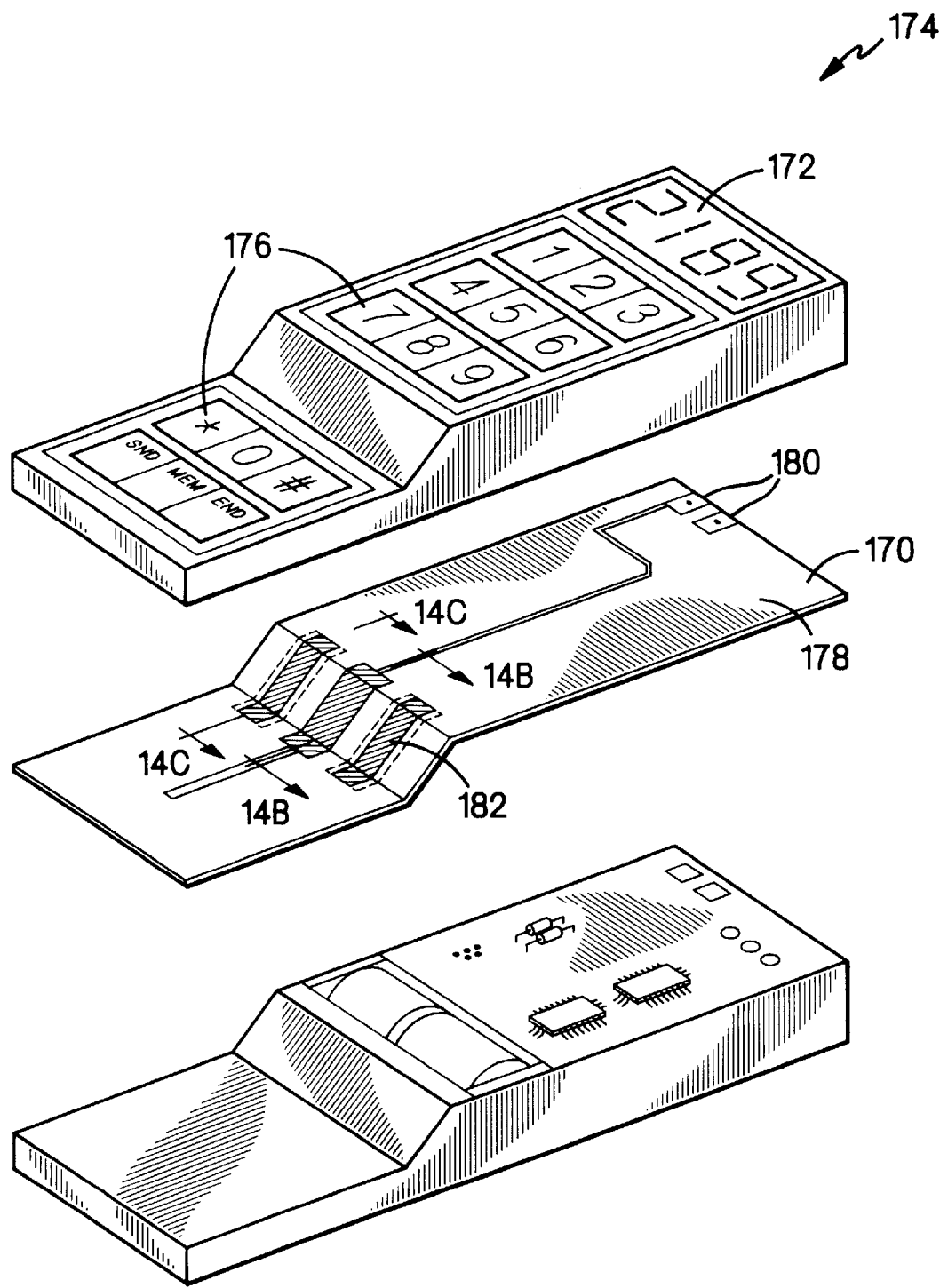
FIG. 14A is an exploded view of a hand-held telephone having a molded electroluminescent lamp according to the invention.

Referring to FIG. 14, in another embodiment, a thermalformed electroluminescent lamp 170 is shown for providing lighting to the front graphic 172 of a hand-held cellular telephone 174. The telephone includes a backlit keyboard 176 on two levels and a single thermalformed lamp 170 creased to conform with the transition region of the graphic. Thermal deformation of this degree may, in certain applications, cause cracking of the indium tin oxide (ITO) conductive coating and the rear electrode carbon ink coating of the lamp 170 along conductive traces 178 which extend from lamp contacts 180. Damage to the ITO layer of the conductive traces 178 can result in diminished light output from those areas of the lamp following the crease. Accordingly, in a preferred embodiment, silver carrier pads 182, in the form of a silver ink are used to bridge across the creased portions in order to maintain a reliable electrical connection across the surface of the lamp 170. Referring to FIGS. 14B and 14C, cross-sectional views through the creased portions of the front and rear electrodes, respectively, of the thermalformed electroluminescent lamp are shown. As is shown in FIG. 14B, a polyester carrier substrate 181 with an ITO layer 183 disposed thereon has silver carrier pad 182 screen printed over the portions to be thermalformed. Phosphor, dielectric and rear electrode layers 184, 185 and 186 respectively, are subsequently deposited in succession over the silver carrier pad and ITO layer. Referring to FIG. 14C, the same process is used to provide a silver carrier pad through a rear electrode portion of the thermalformed lamp with the exception that the ITO layer 183 is laser etched at a region 187 prior to deposition of the phosphor, dielectric and rear electrode layers to provide isolation between the front and rear electrodes.

Because the mechanical force necessary to deform a structural thermoplastic circuit board member is generally greater than that required to deform the relatively thin polyester based flexible electroluminescent lamp, it may be desirable, in some applications, to thermalform the lamp prior to placing it on the three-dimensional shaped receptor surface portion of its mating printed circuit. Thus, the lamp is thermalformed to provide a three-dimensional shaped lamp member cooperatively sized and shaped to match with the three-dimensional shaped portion of the mating circuit without subjecting the lamp to the mechanical stresses that are necessary to form the three-dimensional structural portion.

Figure 15A:
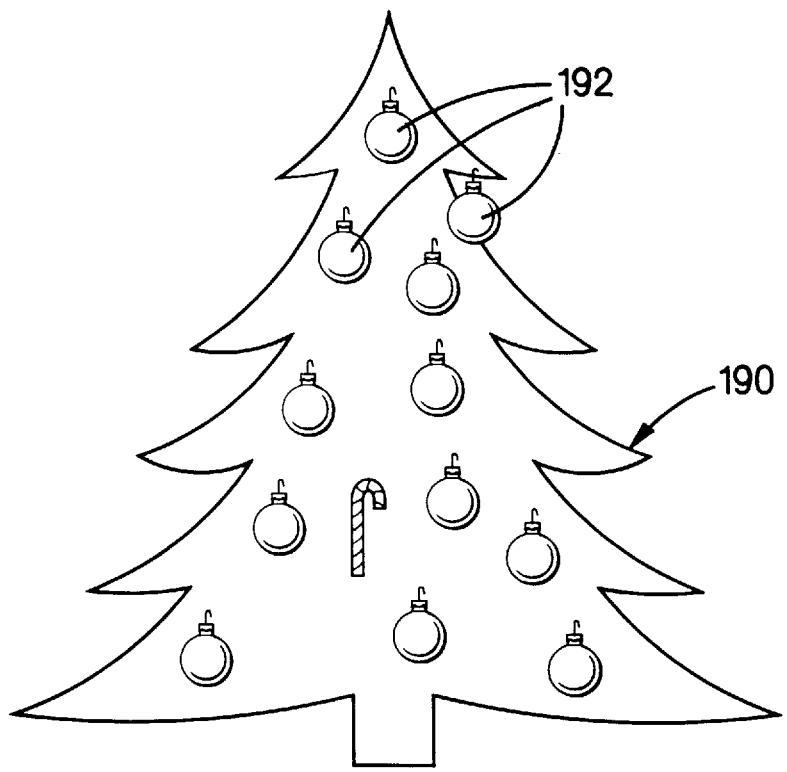
FIG. 15A is a plan view of a decorative figure having embossed electroluminescent lamps.
Figure 15B:
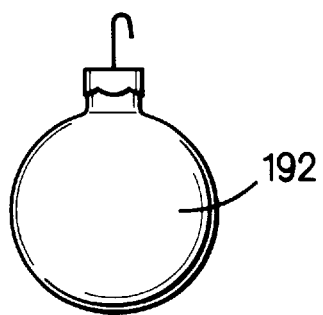
FIG. 15B is a front view of an embossed electroluminescent lamp of FIG. 15A.
Figure 15C:
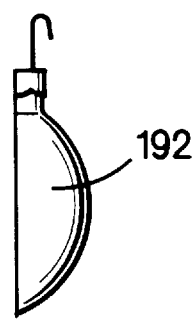
FIG. 15C is a side view of an embossed electroluminescent lamp of FIG. 15A.
Figure 15D:
FIG. 15D is a top view of an embossed electroluminescent lamp of FIG. 15A.

The method of thermalforming can be used to provide three dimensionality to illuminated objects to highlight particular features and to increase the aesthetic nature of a product. Emblems or badges used as decorative or promotional items having illuminated portions may benefit from such a method. Referring to FIG. 15A, for example, a Christmas tree 190 includes electroluminescent lamps 192 representing ornamental balls placed on the tree. Each lamp may be thermalformed using a process such as the approach described above in conjunction with FIGS. 11A–11C to cause the ornamental balls to be raised from the surface of the sheet in semi-spherical form. FIGS. 15B, 15C, and 15D show a thermalformed lamp in front, side and top views, respectively. The lamps, embossed in this way, are more pronounced and more closely represent real Christmas ornaments hanging from a tree. In another embodiment, a pair of semi-spherical electroluminescent lamps disposed adjacent to each other on a relatively thin substrate may be hinged together by a living hinge formed by the substrate so that folding one lamp over the other provides a single illuminated spherically shaped lamp.

It is appreciated that thermalforming of electroluminescent lamps may be applied to provide a raised or embossed image, such as the ornamental balls described above, or may be "debossed" to provide the image in a depressed form. Both approaches provide the added dimensionality to accentuate the images represented by the lamps and increase the aesthetics of the normally flat lamp.

Figure 16:
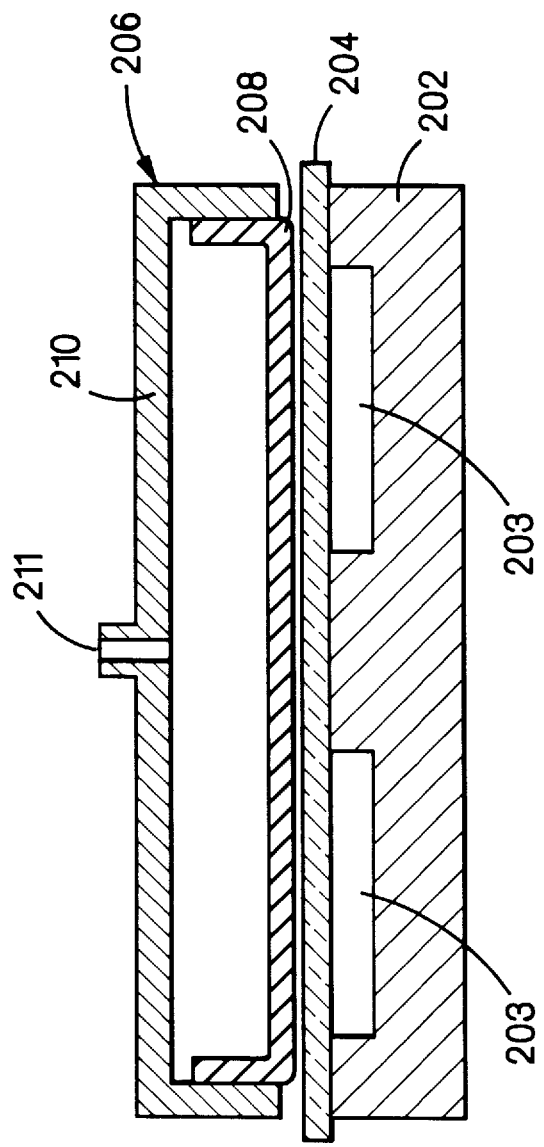
FIG. 16 is a cross-sectional side view of an alternate arrangement for forming an electroluminescent lamp.

Embossing or debossing the electroluminescent lamps may be accomplished using the method described above in conjunction with FIG. 11A. Alternatively, an alternative mechanism, as shown in FIG. 16, includes a molding tool member 202 having concave portions 203 representing the shape of the emboss or debossed image. A sheet-form electroluminescent lamp 204 is placed over molding tool 202 and a pneumatic pressure member 206 having an elastomeric membrane 208 attached to a rigid backplate 210 is used to thermalform lamp 240. In operation, molding tool member 202 is heated to the desired temperature and pneumatic pressure member 206 lowered until edge portions of rigid backplate 210 engage the surface of the lamp. In some embodiments it may be desirable to apply additional heat through rigid backplate 210. Pneumatic pressure is applied to an inflation port 211 to expand elastomeric membrane 208 with sufficient force to deform lamp 204 within the concave portions of molding tool member 202. Heat is removed from molding tool member 202 and after a sufficient cooling period, the pneumatic pressure member is deflated and the thermalformed lamp removed from molding tool member 202.

It is recognized that in applications where the forming of an electroluminescent lamp does not require precisely defined edges, the lamp may be pressure formed under cooler pressure molding conditions. This, too, will maintain the operational integrity of the carrier substrate and the thermoplastic layers of the formed lamp. The embodiments described above in conjunction with FIGS. 11B, 12A, and 14C are examples of applications where pressure forming may be used to produce a formed shape capable of emitting light. On the other hand, for those embodiments requiring higher definition and more complex shapes (e.g., embossed alphanumeric symbols) thermalforming within the temperatures ranges described is preferable. The "C" clamp and pneumatic pressure producing arrangements described above in conjunction with FIGS. 11A and 16, respectively are both appropriate for pressure forming electroluminescent lamps.

Figure 8A:
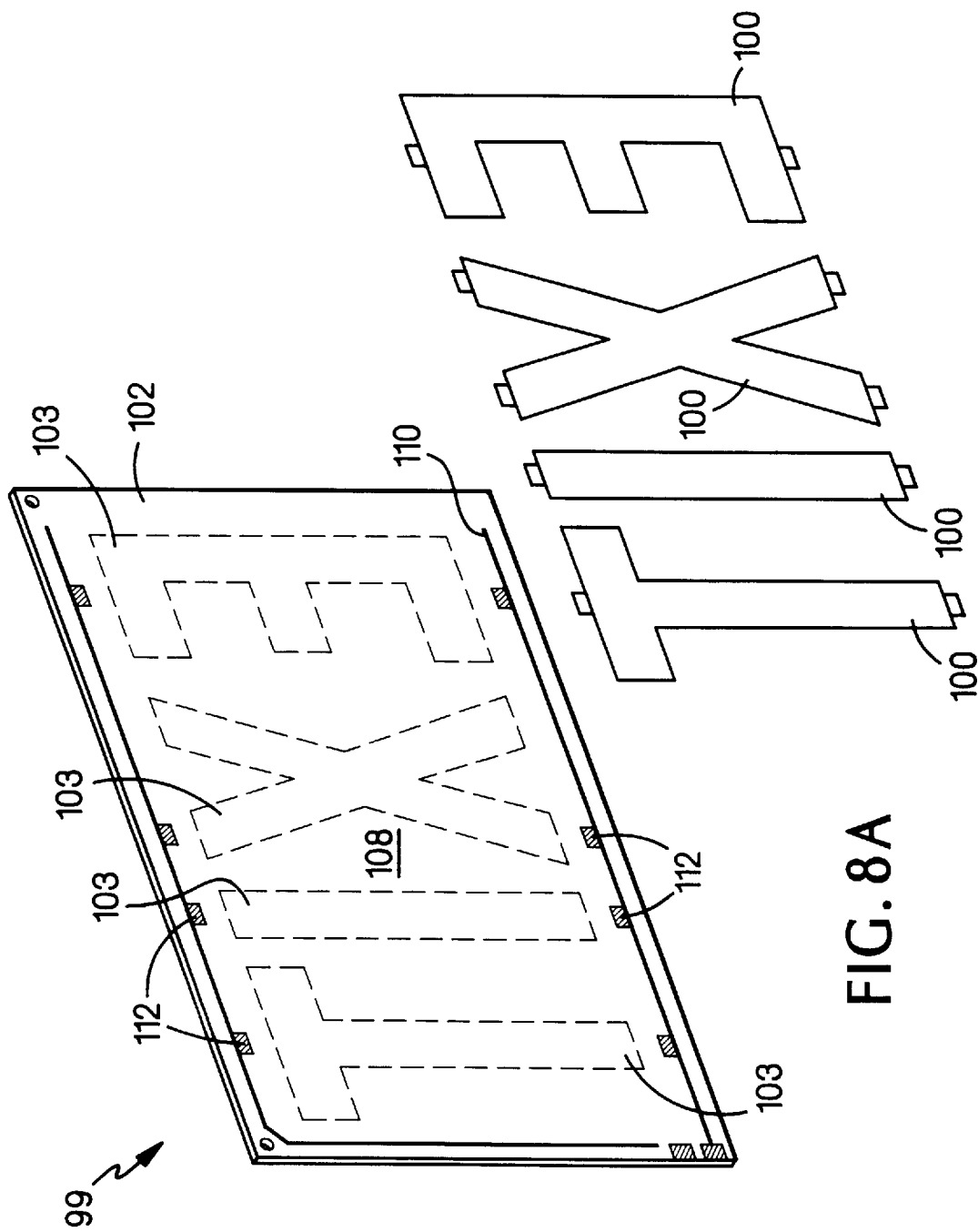
FIG. 8A is an exploded view of a sign having surface mounted lamps according to the invention.
Figure 8B:
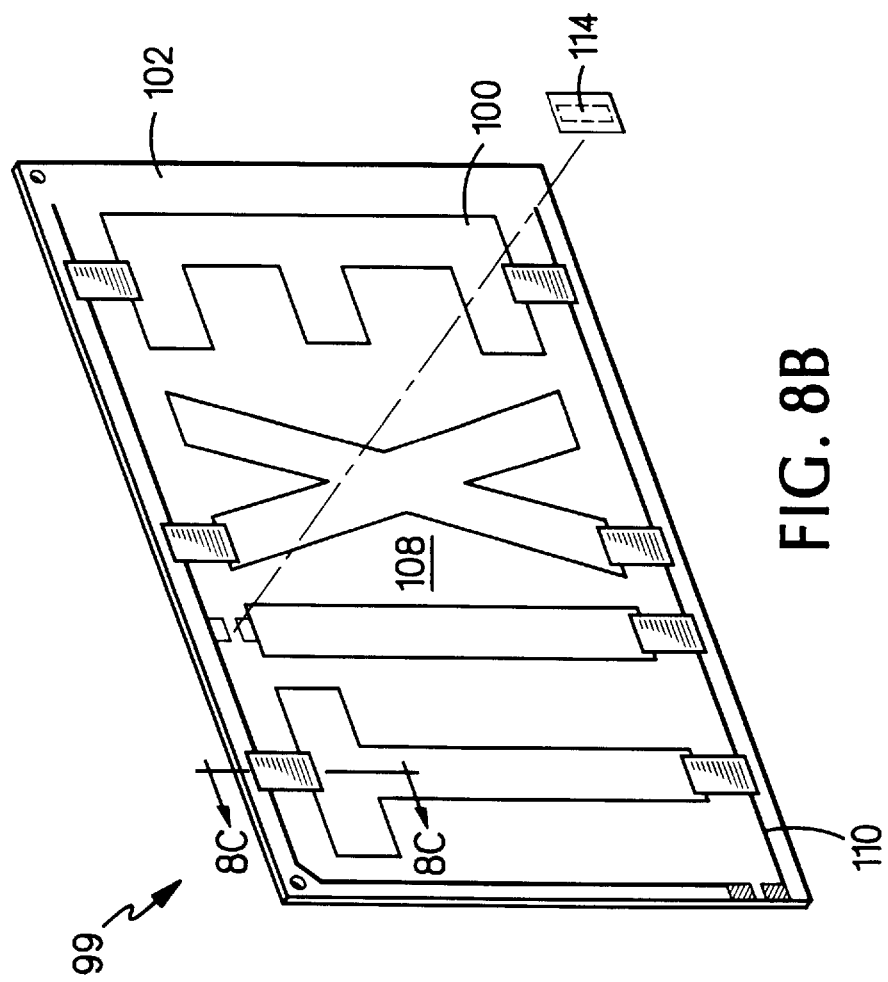
FIG. 8B is an assembled view of the sign of FIG. 8A.
Figure 8C:
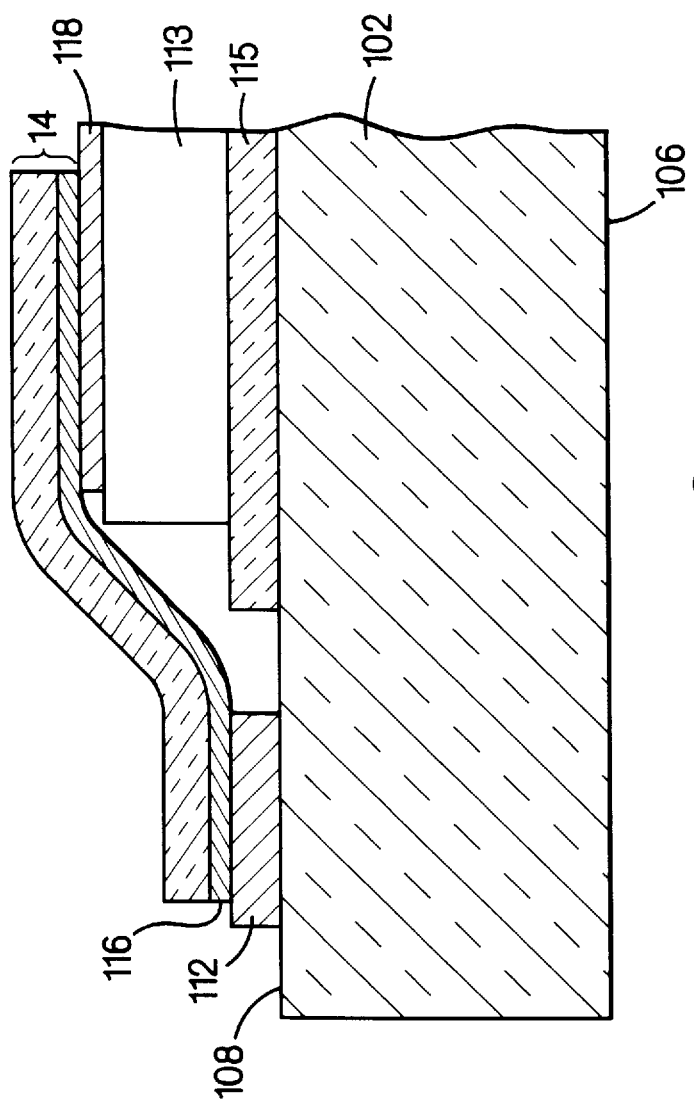
FIG. 8C is a cross-sectional side view of an electroluminescent lamp taken along lines 8C—8C of FIG. 8B.

Referring to FIGS. 8A–8C, electroluminescent lamps 100 are used to light a sign 99. A polycarbonate substrate 102 having a thickness of about 0.020 inches includes a graphic 104 on a front surface 106 with partially transparent areas 103 representing stenciled letters, for example, the word "EXIT". On an opposite rear surface 108 of substrate 102 conductive traces 110 for conveying power to lamps 100 are provided along the outer periphery of substrate 102 having connection pads 112 for attaching lamps 100. Lamps 100 are here fabricated using the process described above in conjunction with FIG. 2. However, described above in conjunction with FIG. 2. However, because lamps 100 in sign 99 are not required to be flexible, rigid lamps may alternatively be employed, still using surface mount techniques, such as described above. Unlike the embodiments described above in conjunction with FIGS. 1 and 8, lit sides 113 of lamps 100 are placed face to face with rear surface 108 (ink side) of substrate 102 and held upon substrate 102 using a thin sheet of transparent adhesive 115 (FIG. 8C) so that the emitted light passes through transparent regions 103. Referring to FIGS. 8B and 8C, flexible polyester jumpers 114 having silver traces 116 on one surface are used to connect rear electrodes on unlit sides 118 of lamps 100 to connection pads 112 of substrate 102. Connection between lamps 100 and conductive traces 110 may be accomplished using any of the above described attachment methods described above in conjunction with FIGS. 3A–3E, 9, and 10.

What is claimed is:

1. An electroluminescent lamp assembly comprising:
    a substrate having a relatively large lamp receiving surface, having an array of conductive traces disposed on said surface of said substrate, and
    a plurality of relatively smaller lamps distributed in spaced-apart relationship according to a preselected illumination pattern over, and secured to, said lamp receiving surface, at least one of said lamps comprising:
    a mechanically flexible multi-layer sheet-form electroluminescent lamp including a sheet-form layer containing electroluminescent particles, said layer disposed between a pair of sheet-form conductive layers, at least one of which is transparent for transmitting light emitted from said particles, and at least one of which is mechanically flexible, said electroluminescent lamp having conductors exposed for engagement with said conductive traces on said substrate, said electroluminescent lamp being surface mounted face-to-face to said substrate in the manner that its conductors engage selected conductive traces on said lamp receiving surface.

2. The electroluminescent lamp assembly of claim 1 wherein said multi-layer sheet-form electroluminescent lamp has a first light emitting characteristic different than a second light emitting characteristic of another of said plurality of relatively smaller lamps.

3. The electroluminescent lamp assembly of claim 2 wherein said first light emitting characteristic has a different color from that of said second light emitting characteristic.

4. The electroluminescent lamp assembly of claim 2 wherein said first light emitting characteristic has a different intensity from that of said second light emitting characteristic.

5. The electroluminescent lamp assembly of claim 1 wherein said substrate is a flexible substrate.

6. The electroluminescent lamp assembly of claim 1 wherein said substrate has an initial shape and is deformed with said surface mounted electroluminescent lamp into a deformed shape.

7. The electroluminescent lamp assembly of claim 6 wherein said substrate is mechanically deformable.

8. The electroluminescent lamp assembly of claim 6 wherein said substrate is a flexible substrate.

9. The electroluminescent lamp assembly of claim 6 wherein said substrate includes a strain relief incision and a desired final configuration of complex shape.

10. The electroluminescent lamp assembly of claim 1 wherein said plurality of relatively smaller lamps further comprises a rigid lamp.

11. The electroluminescent lamp assembly of claim 10 wherein said rigid lamp is of smaller area than said multi-layer sheet-form electroluminescent lamp.

12. The electroluminescent lamp assembly of claim 10 wherein said rigid lamp is surface mounted face-to-face to said substrate.

13. The electroluminescent lamp assembly of claim 1 further comprising securing means for attaching the multi-layer sheet-form electroluminescent lamp to said lamp receiving surface of said substrate.

14. The electroluminescent lamp assembly of claim 13 wherein said securing means comprises a thermal bond between a substance of said lamp and a substance of said substrate.

15. The electroluminescent lamp assembly of claim 14 wherein said thermal bond comprises an ultrasonic weld.

16. The electroluminescent lamp assembly of claim 13 wherein said securing means comprises a mechanical fastener.

17. The electroluminescent lamp assembly of claim 13 wherein said securing means comprises a localized deposit of adhesive at a region of engagement between said conductors of said electroluminescent lamp and said selected conductive traces on said lamp receiving surface of said substrate.

18. The electroluminescent lamp assembly of claim 13 wherein said securing means only contacts the flexible multi-layer sheet-form electroluminescent lamp at the same lamp surface that the substrate's conductors contact the lamp surface.

* * * * *